(12) United States Patent
Hosoya

(10) Patent No.: US 6,259,332 B1
(45) Date of Patent: Jul. 10, 2001

(54) MICROWAVE OSCILLATOR FOR OBTAINING THE LOW PHASE NOISE CHARACTERISTIC

(75) Inventor: Kenichi Hosoya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/413,371

(22) Filed: Oct. 6, 1999

(30) Foreign Application Priority Data

Jun. 10, 1998 (JP) .................................................. 10-284468

(51) Int. Cl.⁷ ...................................................... H03B 5/18
(52) U.S. Cl. ...................... 331/96; 331/99; 331/107 SL; 331/117 D; 333/204
(58) Field of Search ................................ 331/96, 107 SL, 331/117 D, 99; 333/204

(56) References Cited

FOREIGN PATENT DOCUMENTS

| 61-205009 | 9/1986 | (JP) . |
| 62-207007 | 9/1987 | (JP) . |
| 3-140003 | 6/1991 | (JP) . |
| 6-318819 | 11/1994 | (JP) . |
| 7-176954 | 7/1995 | (JP) . |

OTHER PUBLICATIONS

H. Ikematsu et al., "S–Band Voltage Controlled Oscillator with 2 Resonators Coupled by Quarter–wave Transmission Line", The Institute of Electronics, Information and Communication Engineers, (1994), pp. C–43 with Partial Translation.

K. Itoh et al, "Broadband Low Noise Voltage Controlled Oscillator with 2 Resonators Coupled by Quarter–wave Transmission Line", The Institute of Electronics, Information and Communication Engineers, (1993), pp. C–44 with Partial Translation.

K. Kamozaki, "4GHz Miniaturized Low Noise Voltage Controlled Oscillator", The Institute of Electronics, Information and Communication Engineers, (1992), pp. C–60 with Partial Translation.

H. Yoshinaga et al., "W–Band Phemt Oscillator", The Institute of Electronics, Information and Communication Engineers, (1994), pp. C–73 with Partial Translation.

C. Tsironis et al., "Temperature Stabilization of GaAs MESFET", IEEE Transactions of Microwave Theory and Techniques, vol. MTT–31, vol. 3, Mar. 1983, pp. 312–314 with Abstract.

*Primary Examiner*—Arnold Kinkead
(74) *Attorney, Agent, or Firm*—Sughrue, Mion, Zinn, Macpeak & Seas, PLLC

(57) ABSTRACT

A microwave oscillator is disclosed, that comprises an FET, a series feedback short-circuited stub connected to the source terminal of said FET, a transmission line and a capacitor connected in series to the gate terminal of said FET, a gate bias circuit connected to said transmission line through a resistor, a drain bias circuit connected to the drain terminal of said FET through said transmission line, and an output matching circuit, a resonating circuit, and a load resistor connected in series to said transmission line, wherein said output matching circuit is composed of a transmission line and a matching open stub, said resonating circuit being composed of a first open stub and a second open stub, the length of the first open stub being shorter than (2n–1)/4 (where n=1, 2, . . . ) of the wavelength of a fundamental wave by δ (where δ is sufficiently shorter than the wavelength of the fundamental wave), the length of the second open stub being longer than (2n–1)/4 of the wavelength of the fundamental wave by δ.

20 Claims, 18 Drawing Sheets

——— PRESENT INVENTION (FIG. 6)

— — — OSCILLATOR WITHOUT RESONATOR (FIG. 1)

- - - - - - 1/2 WAVELENGTH OPEN STUB RESONATOR (FIG.2)

US 6,259,332 B1

MICROWAVE OSCILLATOR FOR OBTAINING THE LOW PHASE NOISE CHARACTERISTIC

BACKGROUND OF THE INVENTION

1. Field of the Invention

The present invention relates to a microwave oscillator for oscillating a microwave and a millimeter-wave, in particular, to a microwave oscillator for allowing a phase noise of degrading a spectral purity to reduce.

2. Description of the Related Art

With reference to accompanying drawings, a conventional microwave oscillator will be described.

FIG. 1 is a circuit diagram showing the structure of a first example of a conventional microwave oscillator. The microwave oscillator shown in FIG. 1 is a series feedback oscillator of which a feedback short-circuited stub 2 is connected to the source terminal of a field effect transistor (FET) 1. A transmission line 11 and a capacitor 6 are connected in series to the gate terminal of the FET 1. A gate bias circuit 3 supplies a DC bias to the gate terminal of the FET 1 through a spurious oscillation suppression resistor 14 and a transmission line 11. A drain bias circuit 4 supplies a DC bias to the drain terminal of the FET 1 through a transmission line 11.

Each of the bias circuits 3 and 4 is composed of a ½ wavelength line 5, a capacitor 6 short-circuited in a high frequency band region, and a DC power supply 7. An oscillated output signal is extracted from a load resistor 10 through a transmission line 11 and an output matching circuit 8 that are connected in series to the drain terminal of the FET 1. The output matching circuit 8 is composed of a transmission line 11 and a matching open stub 12.

FIG. 2 is a circuit diagram showing the structure of a second example of a conventional microwave oscillator. The microwave oscillator shown in FIG. 2 is composed of the microwave oscillator shown in FIG. 1 and a transmission line resonating circuit 9. The transmission line resonating circuit 9 is composed of a ½ wavelength open stub 25. Examples of the microwave oscillator shown in FIG. 2 are disclosed in "1994 The Institute of Electronics, Information and Communication Engineers, Japan, Spring Convention C-43" and "1993 The Institute of Electronics, Information and Communication Engineers, Japan, C-44", and so forth.

FIG. 3 is a circuit diagram showing the structure of a third example of a conventional microwave oscillator. The microwave oscillator shown in FIG. 3 is composed of the microwave oscillator shown in FIG. 1 and a transmission line resonating circuit 9. In particularly, the transmission line resonating circuit 9 is composed of a capacitor 6 and a ¼ wavelength short-circuited stub 26. The capacitor 6 is short-circuited in a high frequency region.

FIG. 4 is a circuit diagram showing the structure of a fourth example of a conventional microwave oscillator. The microwave oscillator shown in FIG. 4 has a resonating circuit 9 of which the capacitor 6 connected to the gate terminal of the FET 1 in the microwave oscillator shown in FIG. 1 is substituted with a ¼ wavelength open stub 27. Examples of the microwave oscillator shown in FIG. 4 are disclosed in "1994 The Institute of Electronics, Information and Communication Engineers, Japan, Spring Convention C-73" and "1992 The Institute of Electronics, Information and Communication Engineers, Japan, C-60", and so forth.

FIG. 5 is a circuit diagram showing the structure of a fifth example of a conventional microwave oscillator. The microwave oscillator shown in FIG. 5 is composed of the microwave oscillator shown in FIG. 1 and a resonating circuit 9. The resonating circuit 9 is composed of a coupling transmission line 28 and a dielectric resonator 29. Examples of the microwave oscillator shown in FIG. 5 are disclosed in "IEEE Transaction on Microwave Theory and Techniques, Vol, MTT-31, p. 312" and so forth.

Although microwave oscillators having the above-described dielectric resonator 29 are disclosed in Japanese Patent Laid Open Publication Nos. Sho-61-205009, Hei-3-140003, and Hei-7-176954, these related art references do not mention the reduction of the size of the structure.

However, in the first example of the conventional microwave oscillator shown in FIG. 1, since it does not contain a resonant circuit with a sharp frequency characteristic, the quality factor Q value of the circuit is small and the phase noise thereof is large.

On the other hand, since the second to fourth examples of the conventional microwave oscillators shown in FIGS. 2 to 4 have a transmission line resonating circuit of which one of a transmission line is opened or short-circuited is disposed, the Q value of the circuit increases and thereby the phase noise reduces. These transmission line resonators can be easily structured with small planar circuits. However, since the unloaded Q value is not large, the phase noise cannot be sufficiently reduced.

On the other hand, in the fifth example of the conventional microwave oscillator shown in FIG. 5, with a resonating circuit 9 of which a dielectric resonator 29 is magnetically coupled with a coupling transmission line 28, the phase noise is reduced. Since the dielectric resonator has a very large unloaded Q value, the phase noise can be remarkably reduced. However, the size and cost of the circuit and the module become large. In addition, the fabrication cost becomes large.

SUMMARY OF THE INVENTION

The present invention is made from the above-described point of view. An object of the present invention is to provide a microwave oscillator that is small in size and low in fabrication cost and that has an excellent phase noise characteristic.

The present invention is a microwave oscillator for oscillating a microwave signal, comprising a resonating circuit having a first open stub and a second open stub connected in parallel, the length of the first open stub being shorter than $(2n-1)/4$ (where $n=1, 2, \ldots$) of the wavelength of a fundamental wave by $\delta$ (where $\delta$ is sufficiently shorter than the wavelength of the fundamental wave), the length of the second open stub being longer than $(2n-1)/4$ of the wavelength of the fundamental wave by $\delta$.

The present invention is a microwave oscillator for oscillating a microwave signal, comprising a plurality of resonating circuits each of which has a first open stub and a second open stub, the resonating circuits being connected in parallel, the length of the first open stub being shorter than $(2n-1)/4$ (where $n=1, 2, \ldots$) of the wavelength of a fundamental wave by $\delta$ (where $\delta$ is sufficiently shorter than the wavelength of the fundamental wave), the length of the second open stub being longer than $(2n-1)/4$ of the wavelength of the fundamental wave by $\delta$, the values of n of the resonating circuits being always not the same, the values of $\delta$ of the resonating circuits being always not the same.

The present invention is a microwave oscillator for oscillating a microwave signal, comprising a resonating circuit having a first short stub and a second short stub connected in parallel, the length of the first short stub being shorter than n/2 (where n=1, 2, . . . ) of the wavelength of a fundamental wave by δ (where δ is sufficiently shorter than the wavelength of the fundamental wave), the length of the second short stub being longer than n/2 of the wavelength of the fundamental wave by δ.

The present invention is a microwave oscillator for oscillating a microwave signal, comprising a plurality of resonating circuits each of which has a first short stub and a second short stub, the resonating circuits being connected in parallel, the length of the first short stub being shorter than n/2 (where n=1, 2, . . . ) of the wavelength of a fundamental wave by δ (where δ is sufficiently shorter than the wavelength of the fundamental wave), the length of the second short stub being longer than n/2 of the wavelength of the fundamental wave by δ, the values of n of the resonating circuits being always not the same, the values of δ of the resonating circuits being always not the same.

The present invention is a microwave oscillator of series feedback, comprising an FET, a series feedback short-circuited stub connected to the source terminal of the FET, a transmission line and a capacitor connected in series to the gate terminal of the FET, a gate bias circuit connected to the transmission line through a resistor, a drain bias circuit connected to the drain terminal of the FET through the transmission line, and an output matching circuit, a resonating circuit, and a load resistor connected in series to the transmission line, wherein the output matching circuit is composed of a transmission line and a matching open stub, the resonating circuit being composed of a first open stub and a second open stub, the length of the first open stub being shorter than (2n−1)/4 (where n=1, 2, . . . ) of the wavelength of a fundamental wave by δ (where δ is sufficiently shorter than the wavelength of the fundamental wave), the length of the second open stub being longer than (2n−1)/4 of the wavelength of the fundamental wave by δ.

The microwave oscillator according to the present invention can be also used as a millimeter-wave oscillator. The microwave oscillator can be used for an MMIC (Monolithic Microwave Integrated Circuit) and HIC (Hybrid Integrated Circuit).

These and other objects, features and advantages of the present invention will become more apparent in light of the following detailed description of a best mode embodiment thereof, as illustrated in the accompanying drawings.

DESCRIPTION OF THE PREFERRED EMBODIMENTS

Next, before explaining embodiments of the present invention, with reference to the accompanying drawings, aspects of the present invention will be described.
(First Aspect)

Figure 6:
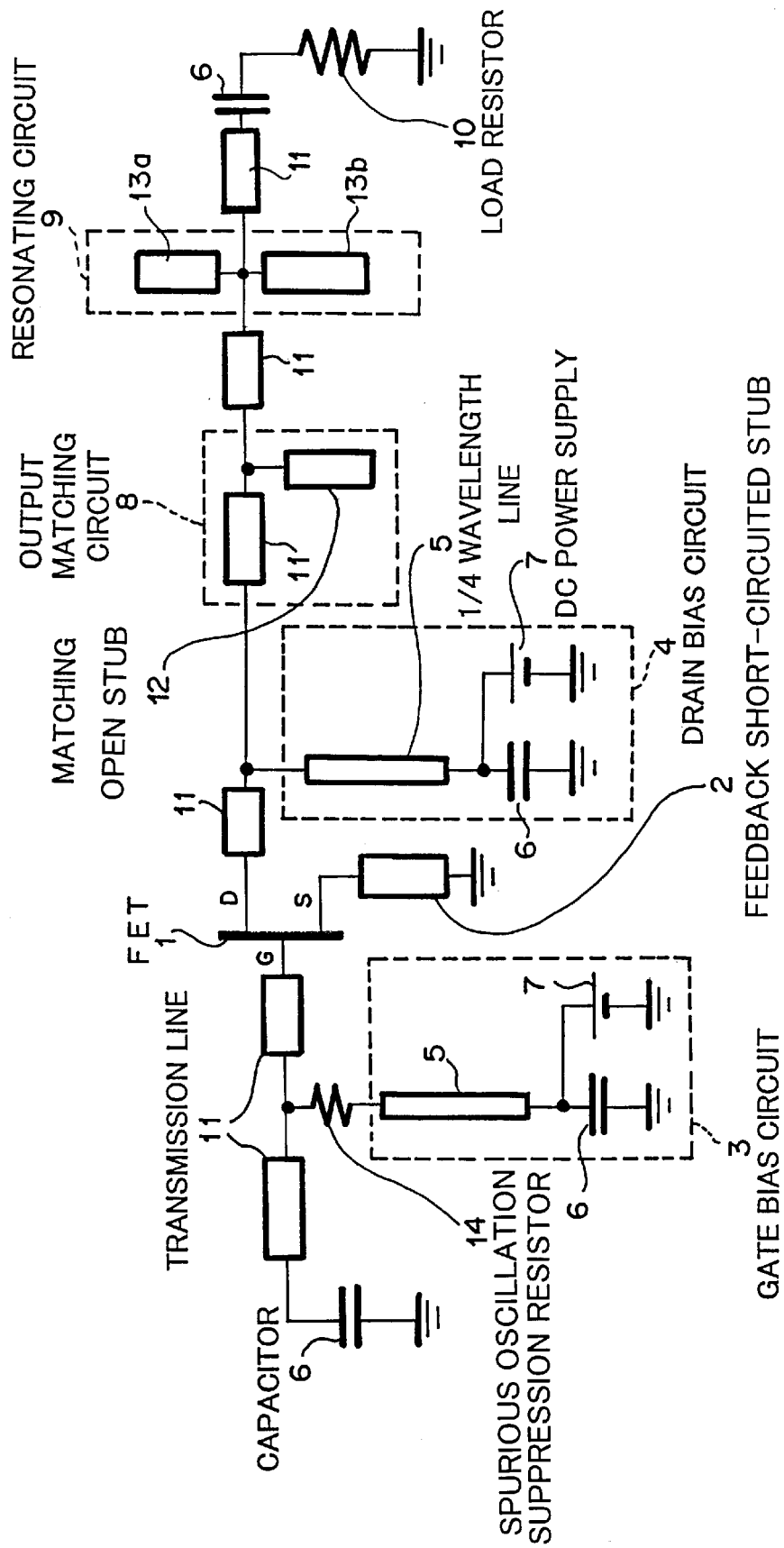
FIG. 6 is a circuit diagram for explaining the structure of a first aspect of the present invention.

FIG. 6 is a circuit diagram showing the structure of a microwave oscillator according to a first aspect of the present invention. The microwave oscillator shown in FIG. 6 is a series feedback oscillator of which a feed back short-circuited stub 2 is connected to the source terminal of an FET 1. A transmission line 11 and a capacitor 6 are connected in series to the gate terminal of the FET 1. A gate bias circuit 3 supplies a DC bias to the gate terminal of the FET 1 through a spurious oscillation suppression resistor 14 and a transmission line 11. A drain bias circuit 4 supplies a DC bias by a DC power supply 7 to the drain terminal of the FET 1 through a transmission line 11. Each of the bias circuits 3 and 4 is composed of a ¼ wavelength line 5, a capacitor 6, and the DC power supply 7.

An oscillated output signal is extracted from a load resistor 10 through an output matching circuit 8, a transmission line 11, a resonating circuit 9, a transmission line 11, and a capacitor 6. The output matching circuit 8 is composed of a transmission line 11 and a matching open stub 12. The resonating circuit 9 is composed of a (λ/4−δ) wavelength open stub 13a and a (λ/4+δ) wavelength open stub 13b. The length of the (λ/4−δ) wavelength open stub 13a is shorter than ¼ of the wavelength of the fundamental wave by δ. The length of the (λ/4+δ) wavelength open stub 13b is longer than ¼ of the wavelength of the fundamental wave by δ.

In this example, δ is sufficiently shorter than the wavelength of the fundamental wave. In reality, δ is in the range from ½00 to ⅒ of the wavelength of the fundamental wave. Preferably, δ is in the range from ¹⁄₁₀₀ to ¹⁄₂₀ of the wavelength of the fundamental wave. This range is determined corresponding to various characteristics such as a phase noise, an output power and a frequency tuning range of the microwave oscillator. In this case, the wavelength represents the effective wavelength of a fundamental electromagnetic wave that propagates an open stub, an short-circuited stub, and a transmission line. The capacitors 6 disposed at a plurality of positions cut off DC components and pass high frequency components. The respective capacitance of the capacitors 6 is not always the same. Likewise, the characteristic impedance, propagation constants, and lengths of the transmission lines 11 are not always the same.

Next, with reference to FIGS. 7 to 9, the effect of the microwave oscillator according to the first aspect of the present invention will be described.

Figure 7:
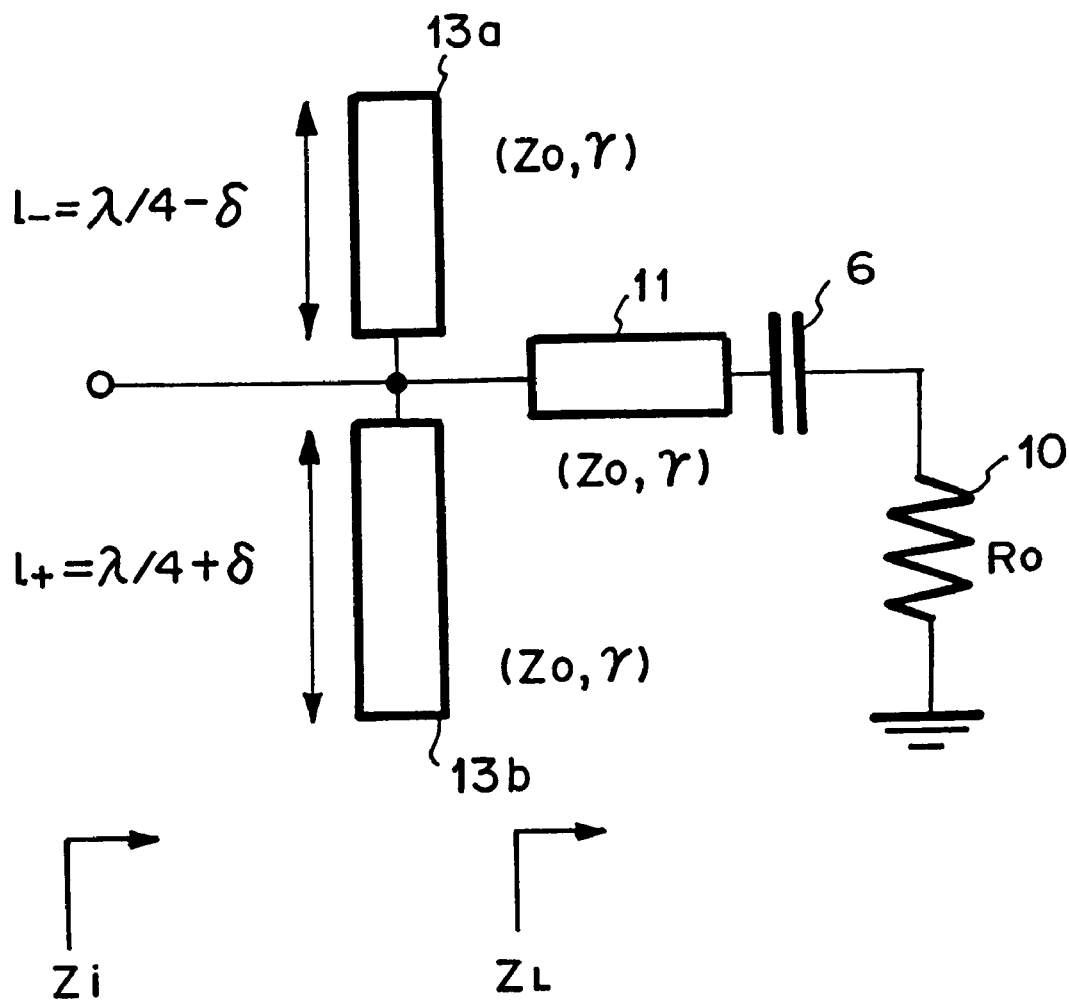
FIG. 7 is a circuit diagram for explaining the effect of the first aspect of the present invention.

FIG. 7 is a circuit diagram showing a portion containing the resonating circuit 9 and the load resistor 10 of the microwave oscillator shown in FIG. 6. In FIG. 7, ($Z_0$, $\gamma$) represents a characteristic impedance and a propagation constant of the ($\lambda/4-\delta$) wavelength open stub 13a, ($\lambda/4+\delta$) wavelength open stub 13b, and the transmission line 11. $R_0$ is the resistance of the load resistor 10. When the impedance viewed from the transmission line 11 to the load resistor 10 is denoted by $Z_L$, ($\lambda/4-\delta$) is denoted by $l_-$, and ($\lambda/4+\delta$) is denoted by $l_+$, the impedance of a two-terminal circuit shown in FIG. 7 can be expressed by formula (1).

$$Zi = \left( \frac{\tanh(\gamma l_-) + \tanh(\gamma l_+)}{Z_0} + \frac{1}{Z_L} \right)^{-1} \quad (1)$$

For simplicity, assuming that the ($\lambda/4-\delta$) wavelength open stub 13a, the ($\lambda/4+\delta$) wavelength open stub 13b, and the transmission line 11 have no loss and that the characteristic impedance is equal to the resistance of the load resistor (namely, $Z_0=R_0$), the formula (1) can be expressed by formula (2).

$$Z_i = R_0 \frac{1}{1 + j(\tan\beta l_- + \tan\beta l_+)} \quad (2)$$

where $\beta$ is the phase constant of the ($\lambda/4-\delta$) wavelength open stub 13a, the ($\lambda/4+\delta$) wavelength open stub 13b, and the transmission line 11.

($\beta l_\pm$) can be expressed as a function of offset angular frequency $\Delta\omega$ against the angular frequency $\omega_0$ of the fundamental wave by formula (3).

$$\beta l_\pm = \frac{\pi}{2}\left[1 + \frac{\Delta\omega}{\omega_0}\right] \pm \delta(\omega_0 + \Delta\omega)\sqrt{LC} \quad (3)$$

where L and C are the inductance and capacitance per unit length of the open stub.

In each formula, since $\Delta\omega=0$ against the fundamental wave, $\beta l_\pm$ is symmetrical with respect to $\pi/2$. Thus, due to odd-symmetry of a tangent function with respect to $\pi/2$, the inside of the parentheses of formula (2) becomes 0. Thus, in the approximation of no-loss, the resonating circuit does not affect the fundamental wave components. On the other hand, $\Delta\omega$ against a frequency in the vicinity of the fundamental wave is not 0. Thus, $\beta l_{35}$ is not symmetrical with respect to $\pi/2$. At this point, the inside of the parentheses of formula (2) is not 0 and becomes very large since the tangent function sharply varies in the vicinity of $\pi/2$. Thus, the two-terminal circuit shown in FIG. 7 has a sharp frequency characteristic.

In designing a real oscillator, since the losses of transmission lines should be considered, formulas (2) and (3) should be rewritten corresponding to such losses. The reason why the circuit shown in FIG. 7 has a sharp frequency characteristic can be roughly explained as described above.

Figure 8:
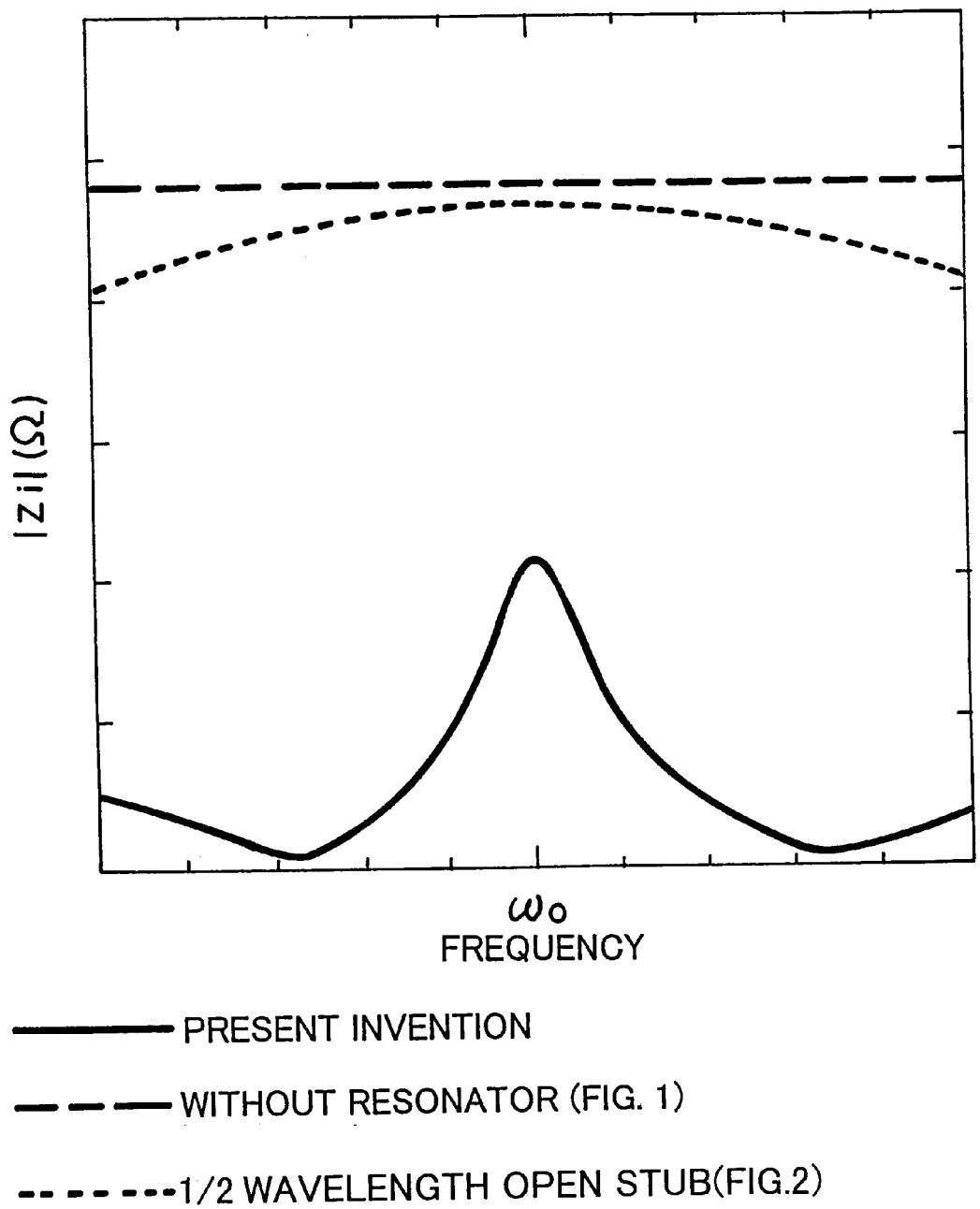
FIG. 8 is a graph showing calculated results for explaining the effect of the first aspect of the present invention.

FIG. 8 is a graph showing the calculated results of a frequency dependency of absolute values of impedance $Z_i$ of the two-terminal circuit shown in FIG. 7. In these calculations, the conductor losses and dielectric losses of the ($\lambda/4-\delta$) wavelength open stub 13a, the ($\lambda/4+\delta$) wavelength open stub 13b, and the transmission lines are considered. FIG. 8 also shows similar calculated results for the first example of the conventional microwave oscillator without the resonating circuit 9 shown in FIG. 1 and the second example of the conventional microwave oscillator with a ½ wavelength open stub resonator shown in FIG. 2. The graph shows that the resonating circuit according to the present invention has a sharper frequency characteristic than those of the microwave oscillator without a resonating circuit and the microwave oscillator with a ½ wavelength open stub resonator.

Figure 1:
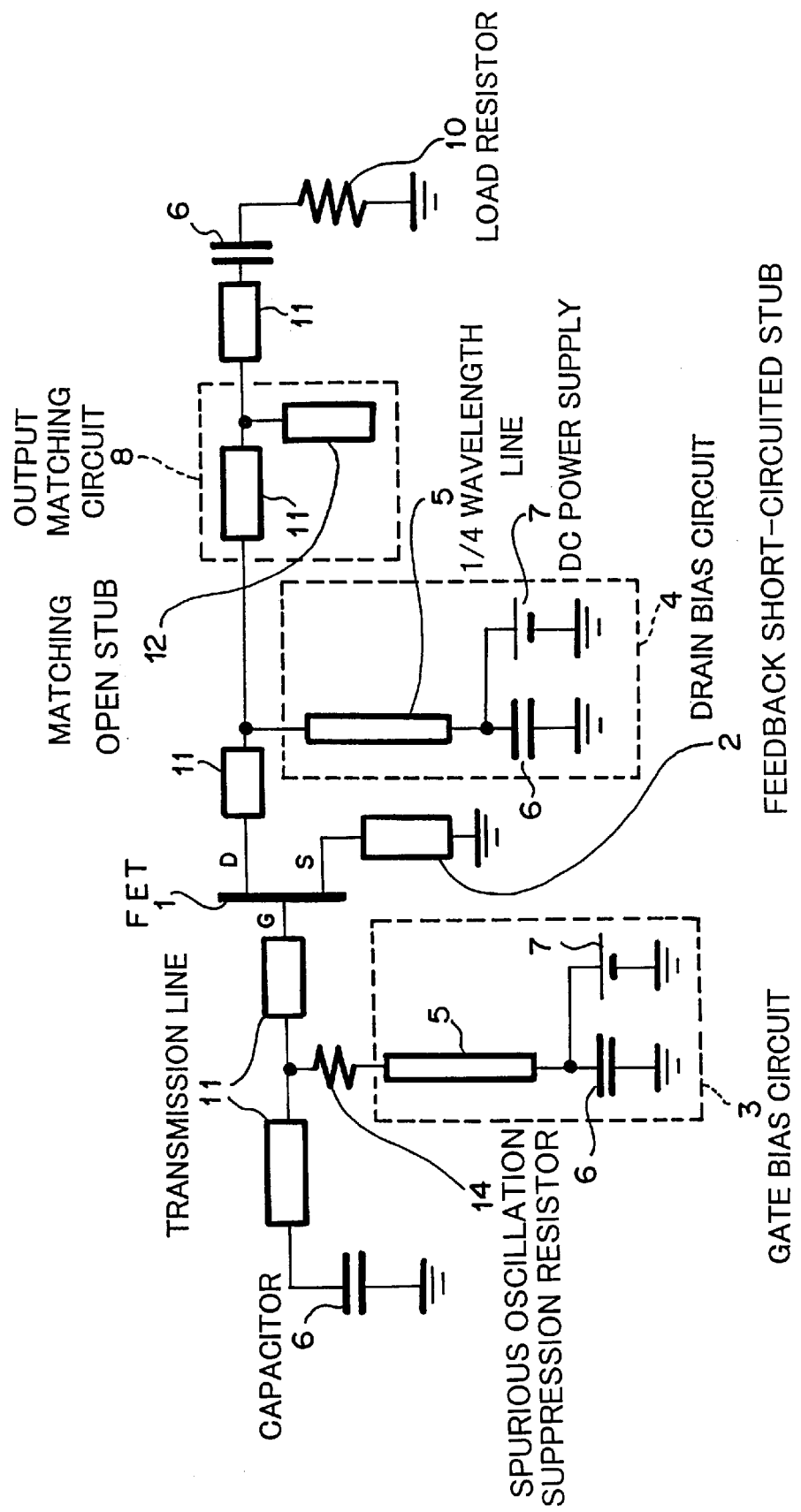
FIG. 1 is a circuit diagram for explaining the structure of a first example of a conventional microwave oscillator.
Figure 2:
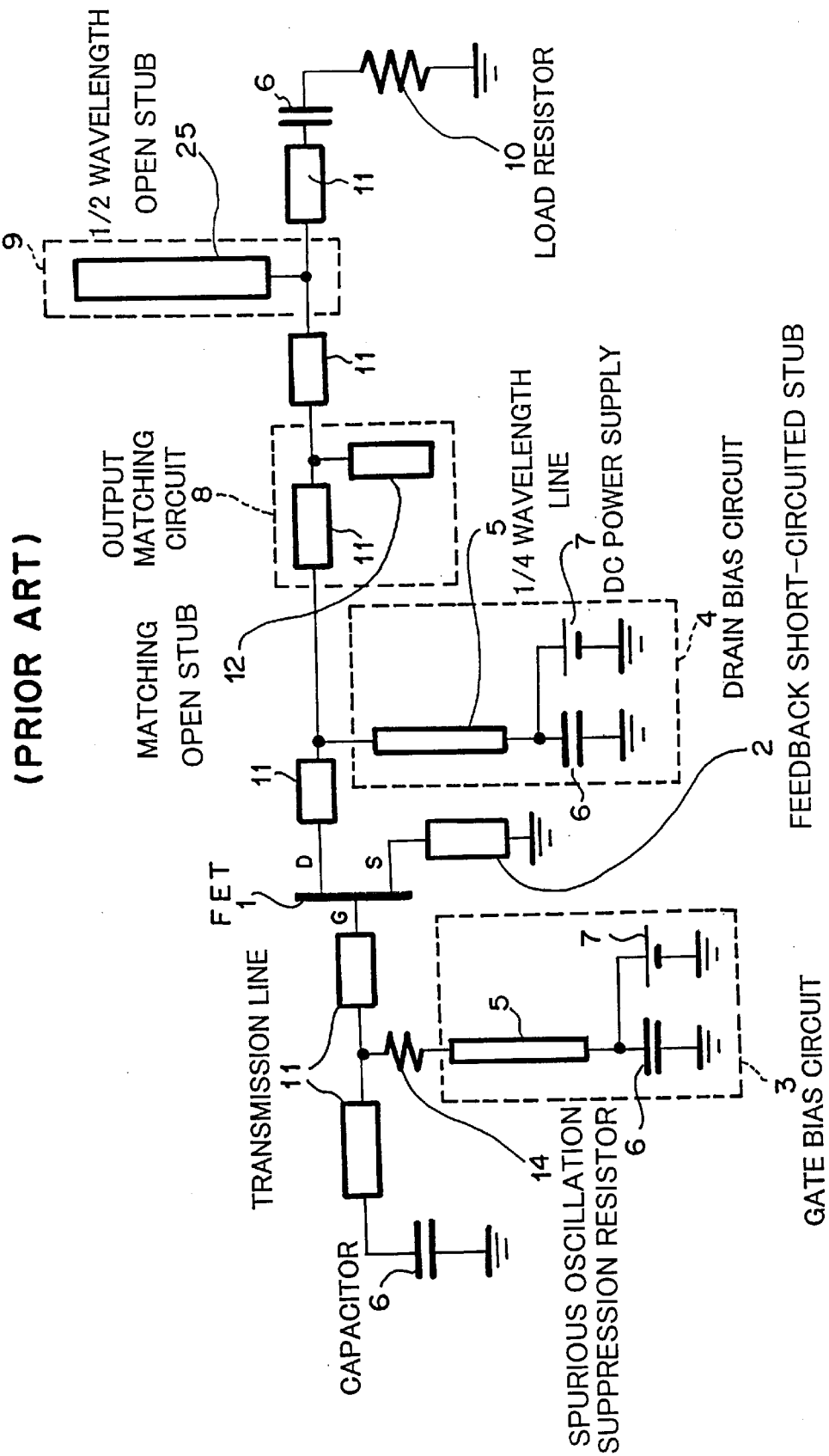
FIG. 2 is a circuit diagram for explaining the structure of a second example of a conventional microwave oscillator having a ½ wavelength open stub resonator.
Figure 3:
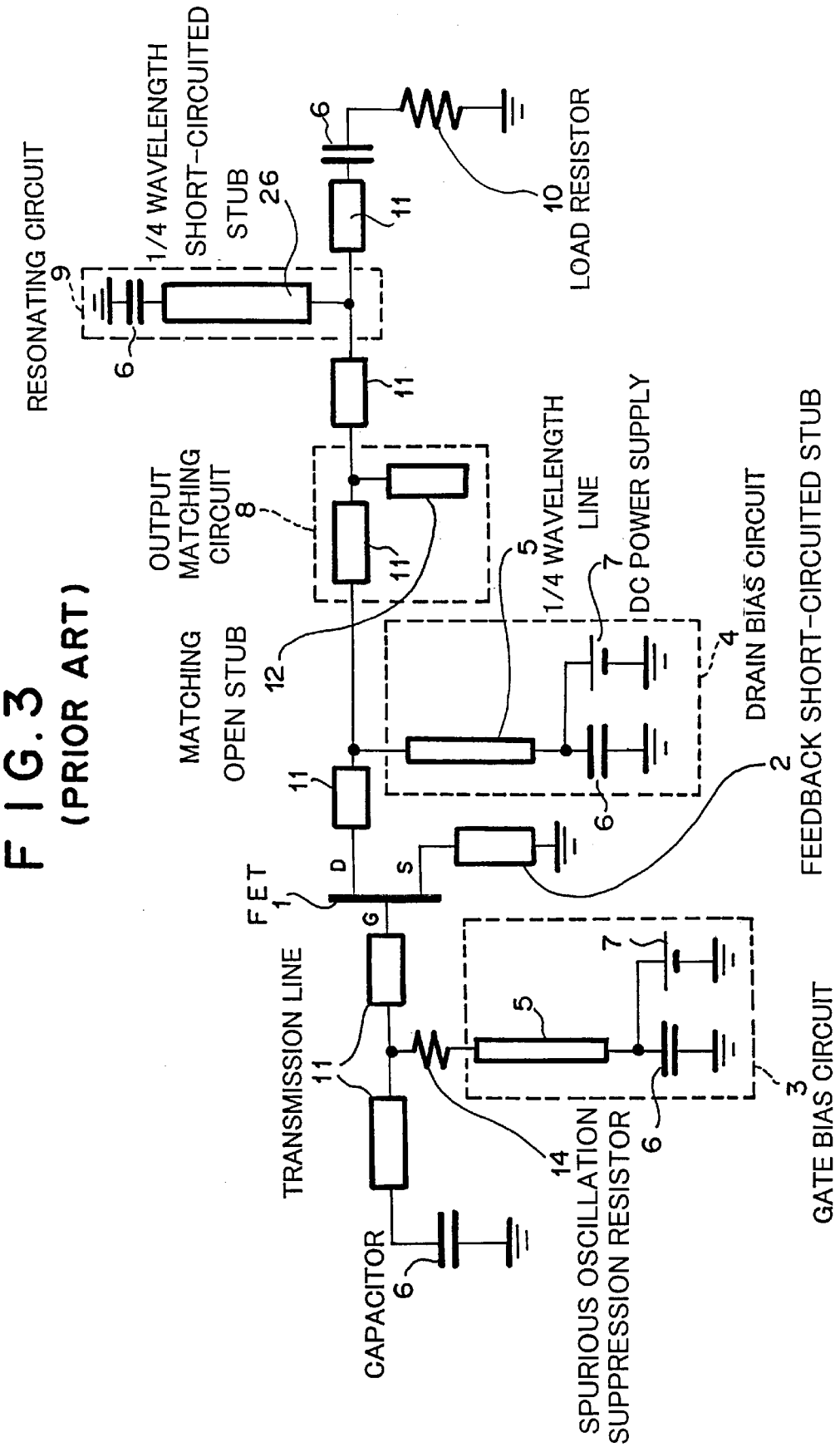
FIG. 3 is a circuit diagram for explaining the structure of a third example of a conventional microwave oscillator having a ¼ wavelength short-circuited stub resonator.
Figure 4:
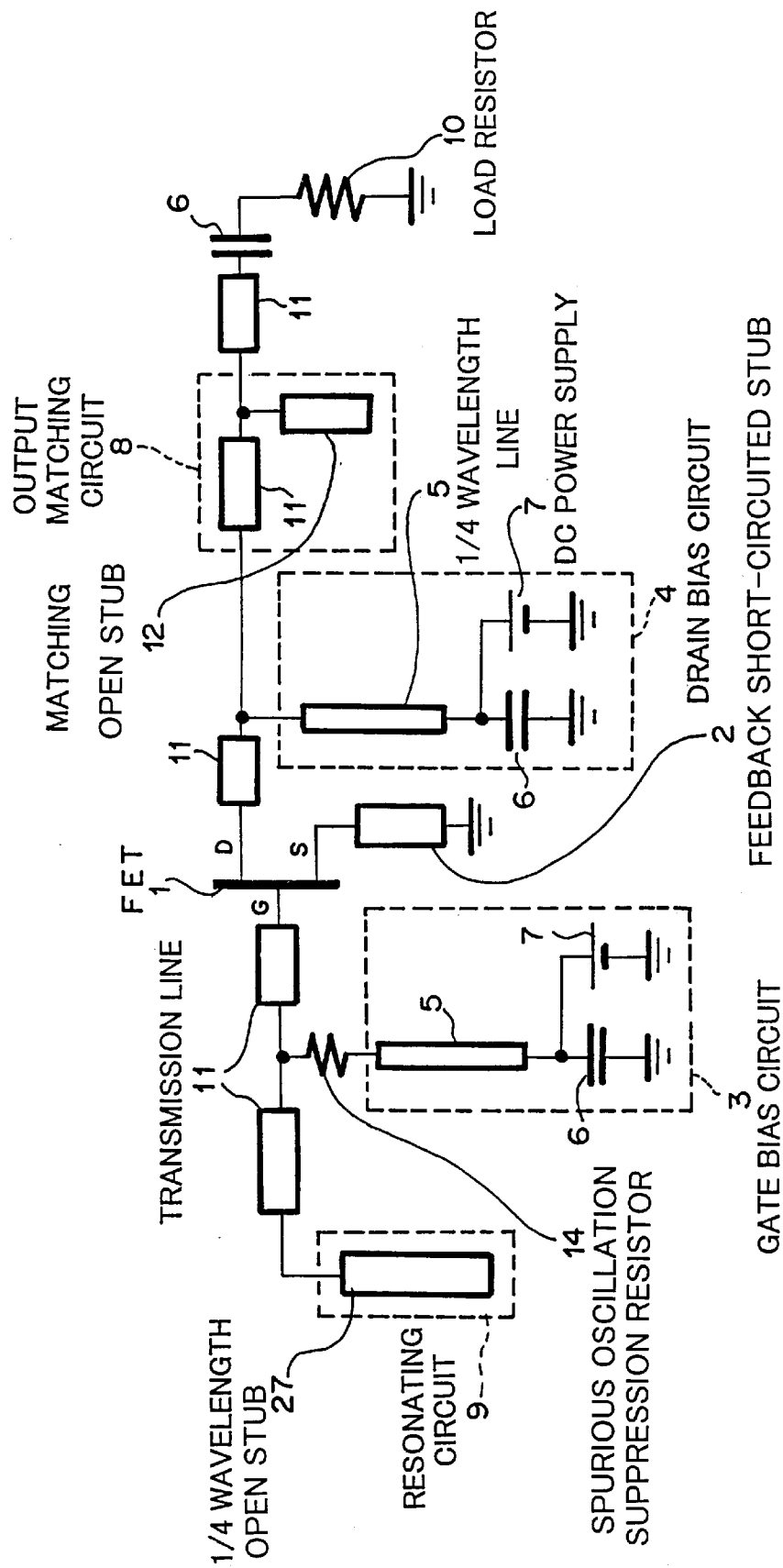
FIG. 4 is a circuit diagram for explaining the structure of a fourth example of a conventional microwave oscillator having a ¼ wavelength open stub resonator.
Figure 5:
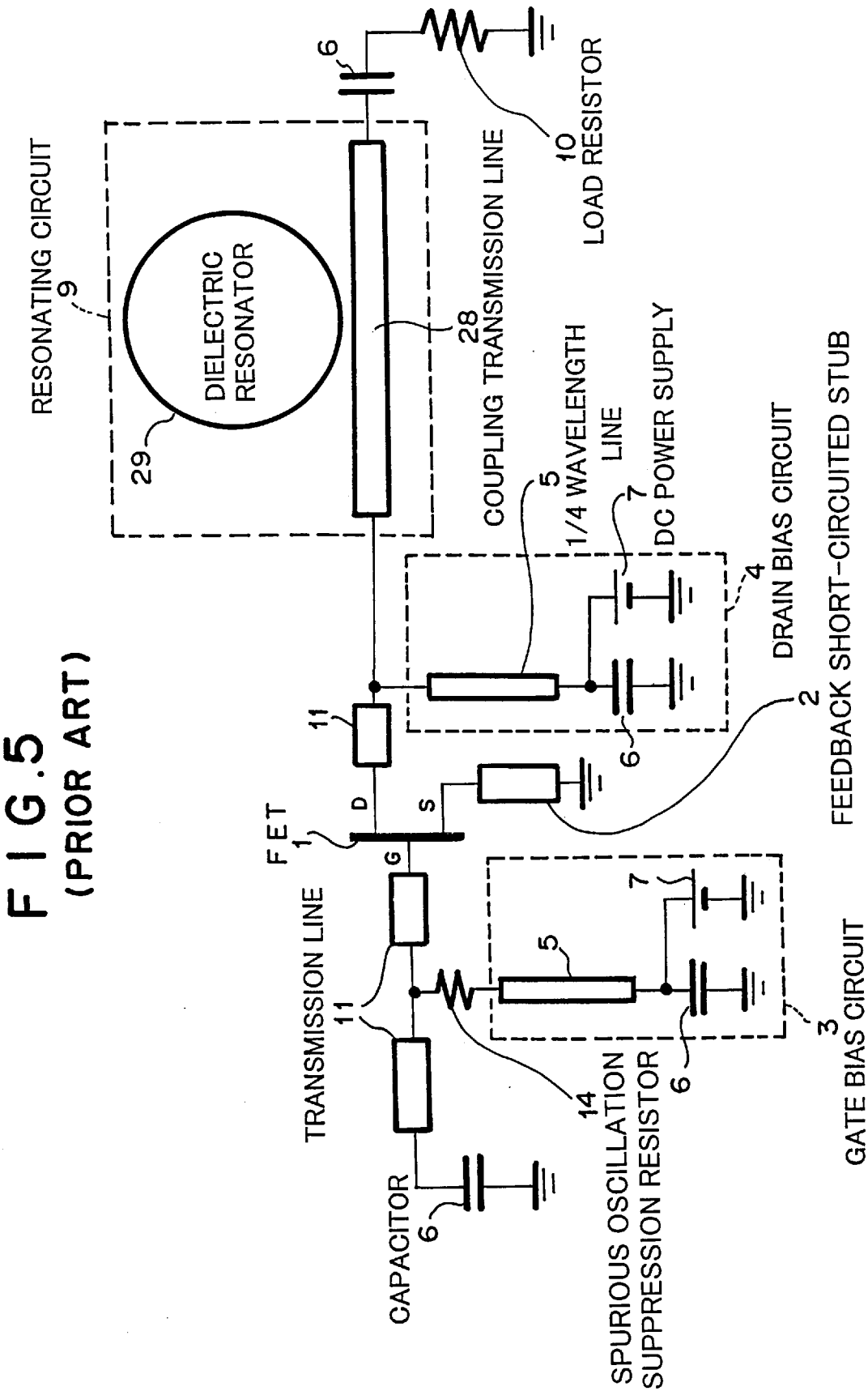
FIG. 5 is a circuit diagram for explaining the structure of a fifth example of a conventional microwave oscillator having a dielectric resonator.
Figure 9:
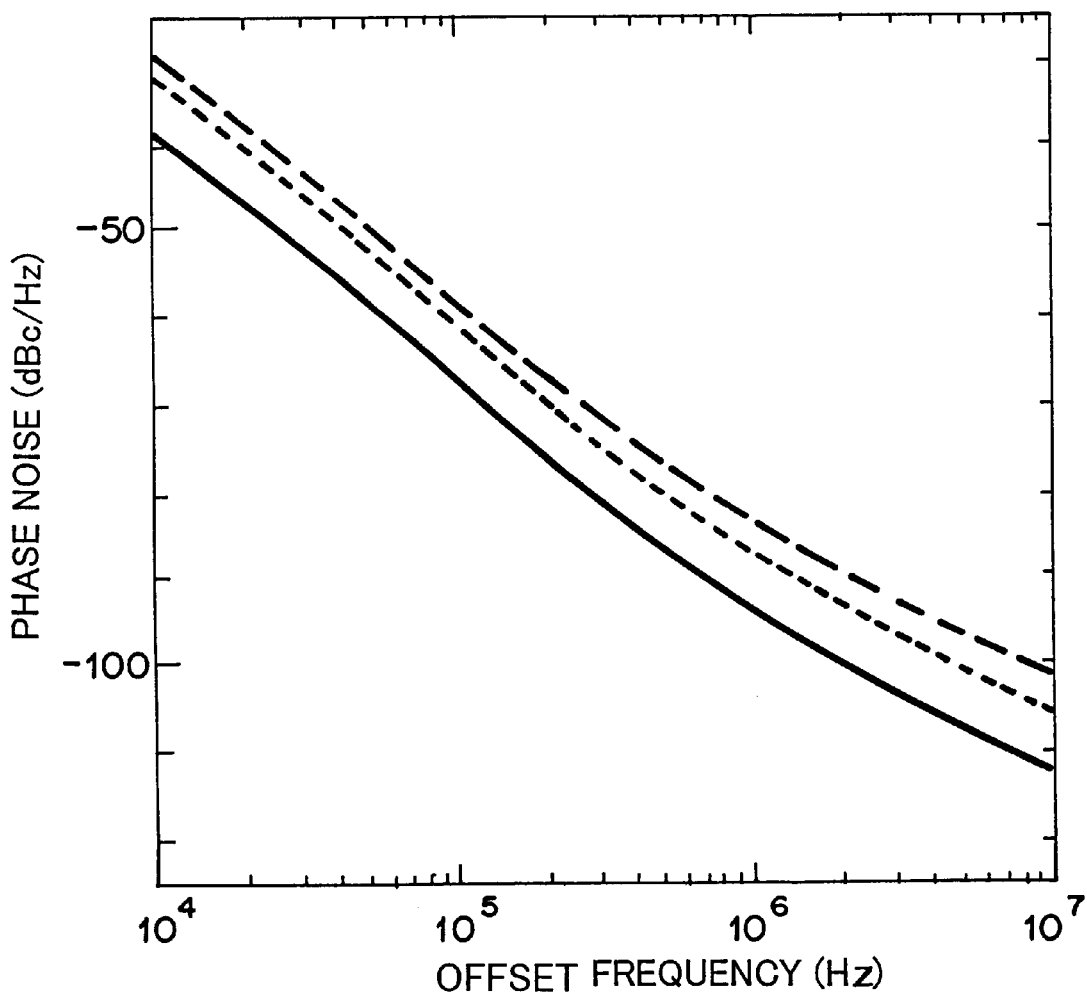
FIG. 9 is a graph showing calculated results for explaining the effect of the first aspect of the present invention.

FIG. 9 is a graph showing the calculated results of phase noises of the microwave oscillator according to the first aspect of the present invention, the conventional microwave oscillator without a resonating circuit shown in FIG. 1, and the conventional microwave oscillator with a ½ wavelength open stub resonator shown in FIG. 2. These phase noises were calculated using harmonic balance method. The graph of FIG. 9 shows that the suppression of the phase noise of the ½ wavelength short-circuited stub shown in FIG. 2 is around 5 dB/Hz, whereas the suppression of the phase noise of the oscillator with the resonating circuit 9 according to the present invention is 10 dB/Hz or more.

(Second Aspect)

Figure 10:
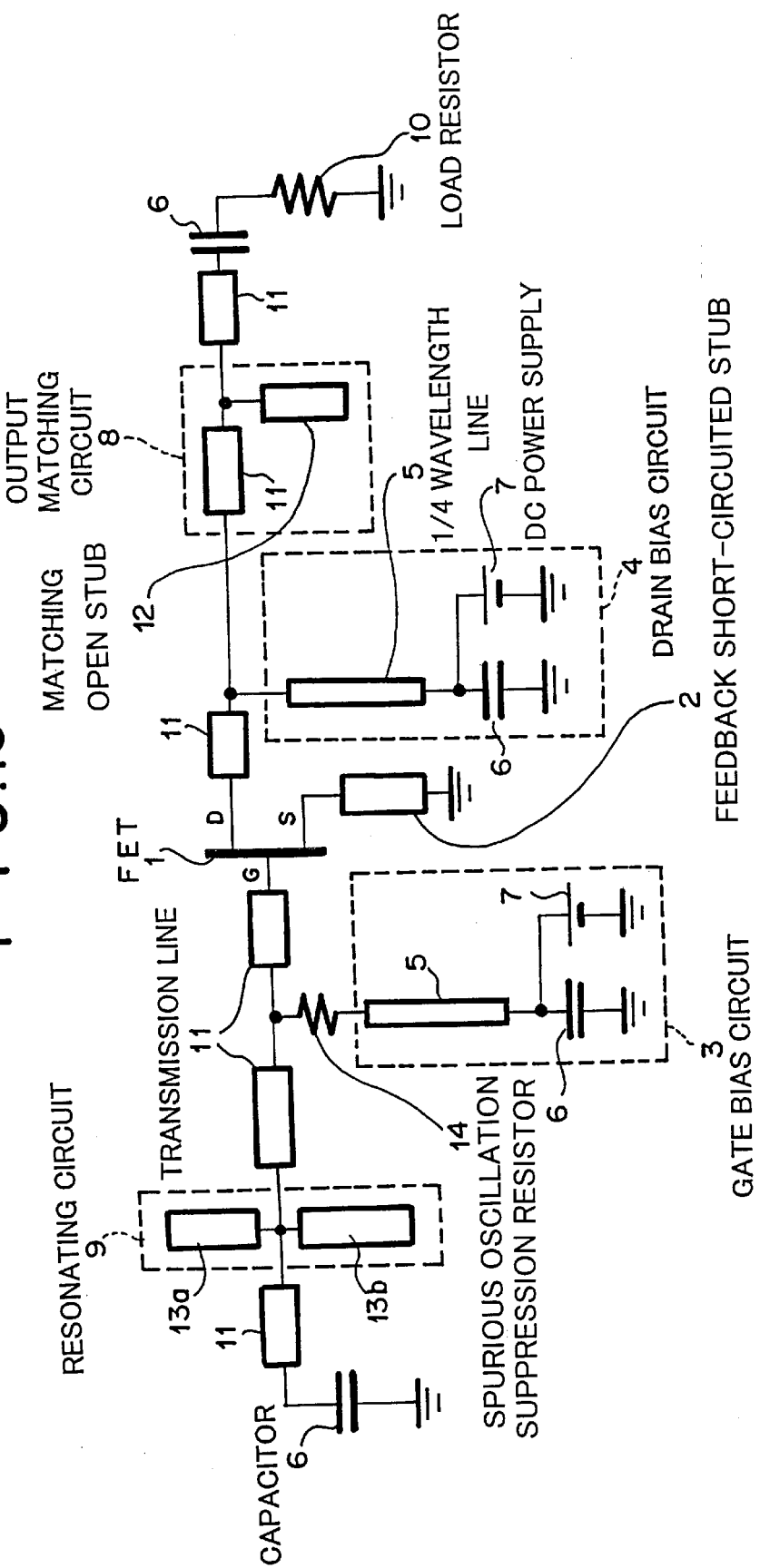
FIG. 10 is a circuit diagram for explaining the structure of a second aspect of the present invention.

FIG. 10 is a circuit diagram showing the structure of a microwave oscillator according to a second aspect of the present invention. The microwave oscillator shown in FIG. 10 has a resonating circuit 9 connected to the gate terminal of an FET 1. The resonating circuit 9 is composed of a($\lambda/4-\delta$) wavelength open stub 13a and a ($\lambda/4+\delta$) wavelength open stub 13b. The length of the ($\lambda/4-\delta$)wavelength open stub 13a is shorter than ¼ of the wavelength of the fundamental wave by $\delta$. The length of the ($\lambda/4+\delta$) wavelength open stub 13b is longer than ¼ of the wavelength of the fundamental wave by $\delta$. In this example, $\delta$ is sufficiently shorter than the wavelength of the fundamental wave, for example, $\delta=\lambda/100 \sim \lambda/10$.

(Third Aspect)

Figure 11:
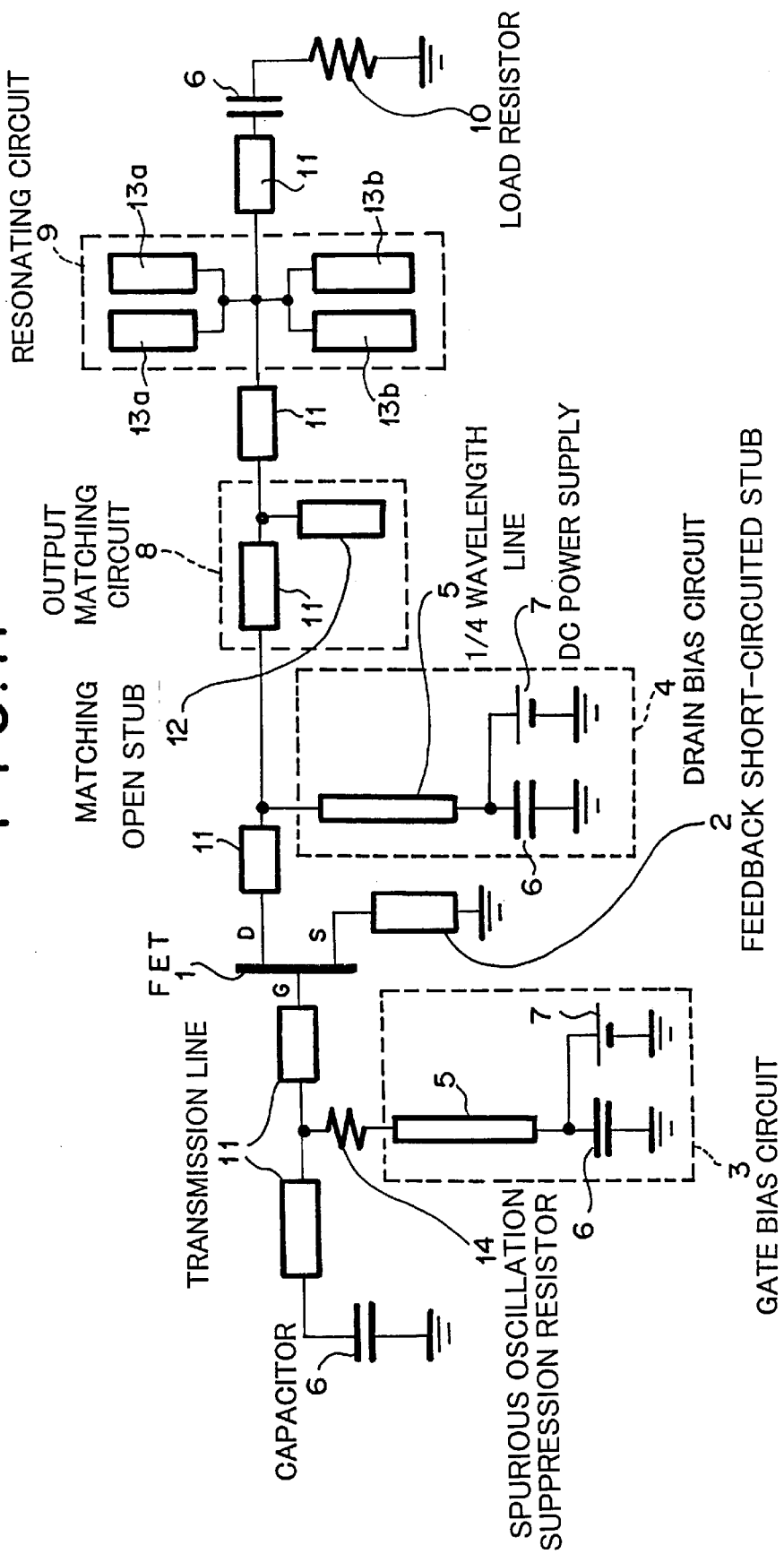
FIG. 11 is a circuit diagram for explaining the structure of a third aspect of the present invention.

FIG. 11 is a circuit diagram showing the structure of a microwave oscillator according to a third aspect of the present invention. The microwave oscillator shown in FIG. 11 has two resonating circuits that are connected in parallel. Each of the resonating circuits is composed of a ($\lambda/4-\delta$) wavelength open stub 13a and a ($\lambda/4+\delta$) wavelength open stub 13b. The length of the ($\lambda/4-\delta$) wavelength open stub 13a is shorter than ¼ of the wavelength of the fundamental wave by $\delta$. The length of the ($\lambda/4+\delta$) wavelength open stub 13b is longer than ¼ of the wavelength of the fundamental wave by $\delta$. In this example, $\delta$ is sufficiently shorter than the wavelength of the fundamental wave.

(Fourth Aspect)

Figure 12:
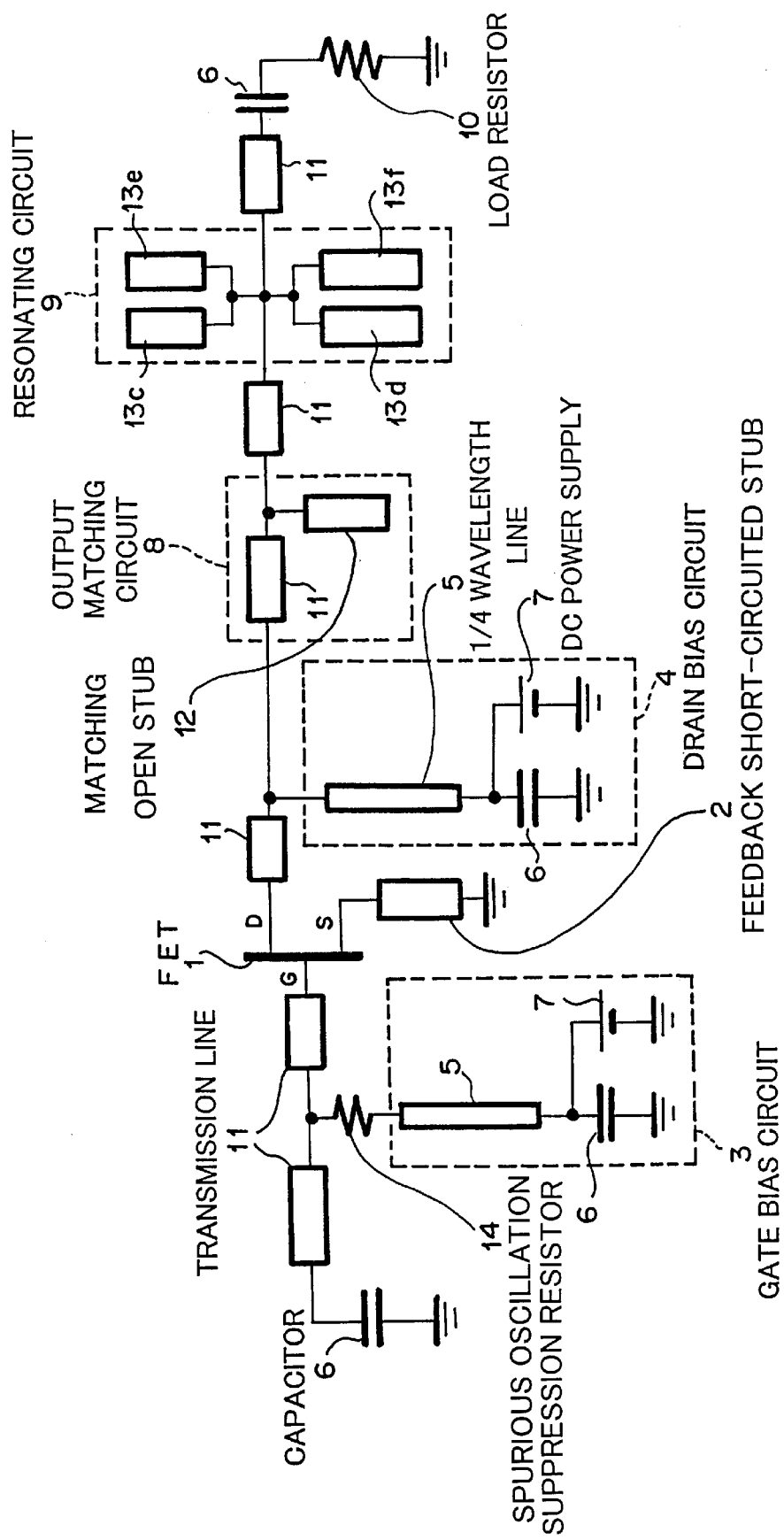
FIG. 12 is a circuit diagram for explaining the structure of a fourth aspect of the present invention.

FIG. 12 is a circuit diagram showing the structure of a microwave oscillator according to a fourth aspect of the present invention. The microwave oscillator shown in FIG. 12 has a first resonating circuit and a second resonating circuit. The first resonating circuit is composed of a ($\lambda/4-\delta_1$) wavelength open stub 13c and a ($\lambda/4+\delta_1$) wavelength open stub 13d. The length of the ($\lambda/4-\delta_1$) wavelength open stub 13c is shorter than ¼ of the wavelength of the fundamental wave by $\delta_1$. The length of the ($\lambda/4+\delta$) wavelength open stub 13d is longer than ¼ of the wavelength of the fundamental wave by $\delta_1$. The second resonating circuit is composed of a ($\lambda/4-\delta_2$) wavelength open stub 13e and a ($\lambda/4+\delta_2$) wavelength open stub 13f. The length of the ($\lambda/4-\delta_2$) wavelength open stub 13e is shorter than ¼ of the wavelength of the fundamental wave by $\delta_2$. The length of the $(\lambda/4+\delta_2)$ wavelength open stub 13f is longer than ¼ of the wavelength of the fundamental wave by $\delta_2$. In this example, each of $\delta_1$ and $\delta_2$ is sufficiently shorter than the wavelength of the fundamental wave.

(Fifth Aspect)

Figure 13:
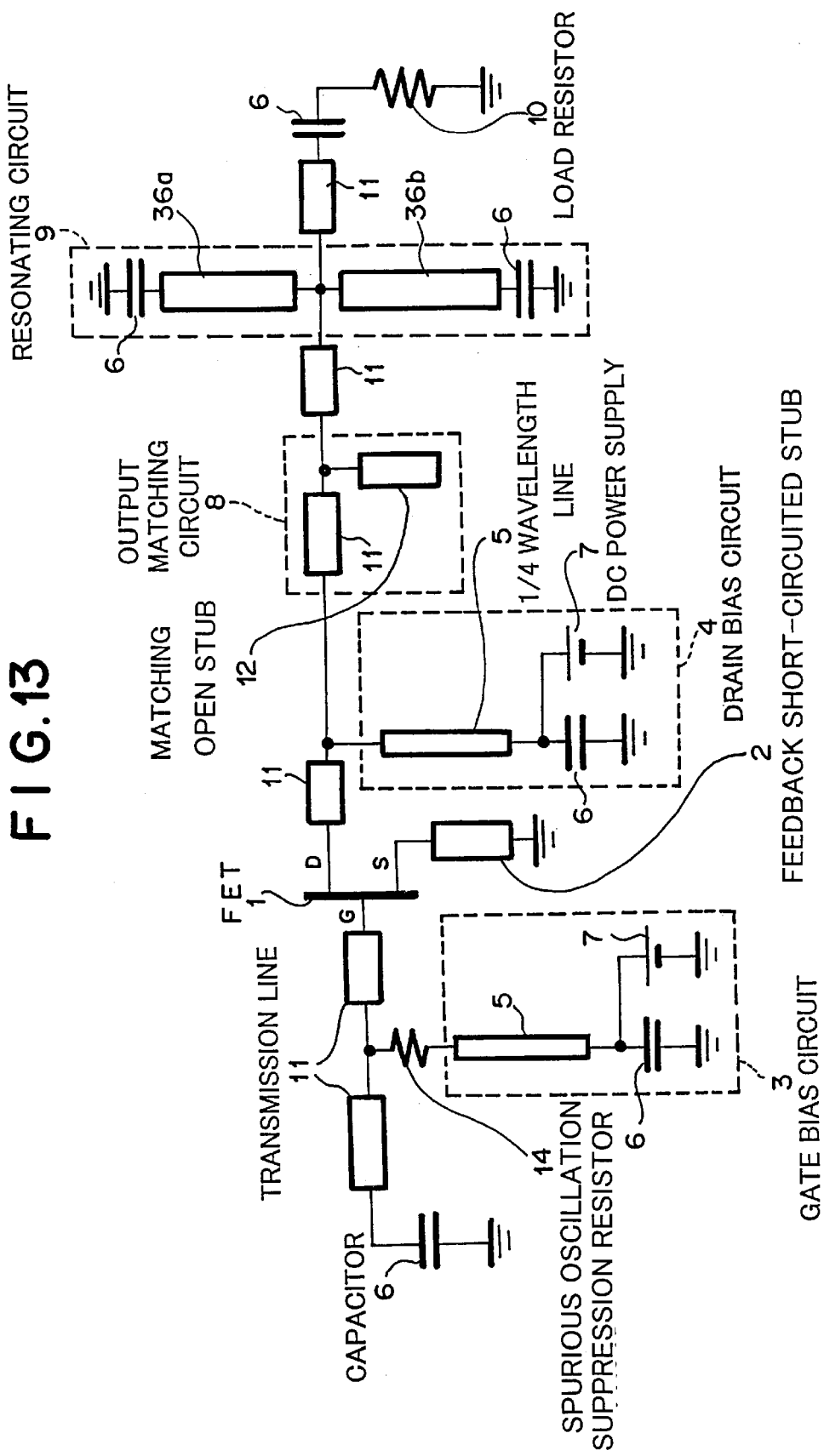
FIG. 13 is a circuit diagram for explaining the structure of a fifth aspect of the present invention.

FIG. 13 is a circuit diagram showing the structure of a microwave oscillator according to a fifth aspect of the present invention. The microwave oscillator shown in FIG. 13 has a resonating circuit 9. The resonating circuit 9 is composed of a $(\lambda/2-\delta)$ wavelength short-circuited stub 36a and a $(\lambda/2+\delta)$ $\delta$ wavelength short-circuited stub 36b. The length of the $(\lambda/2-\delta)$ wavelength short-circuited stub 36a is shorter than ½ of the wavelength of the fundamental wave by $\delta$. The length of the $(A/2-\delta)$ wavelength short-circuited stub 36b is longer than ½ of the wavelength of the fundamental wave by $\delta$. In this example, $\delta$ is sufficiently shorter than the wavelength of the fundamental wave.

Figure 14:
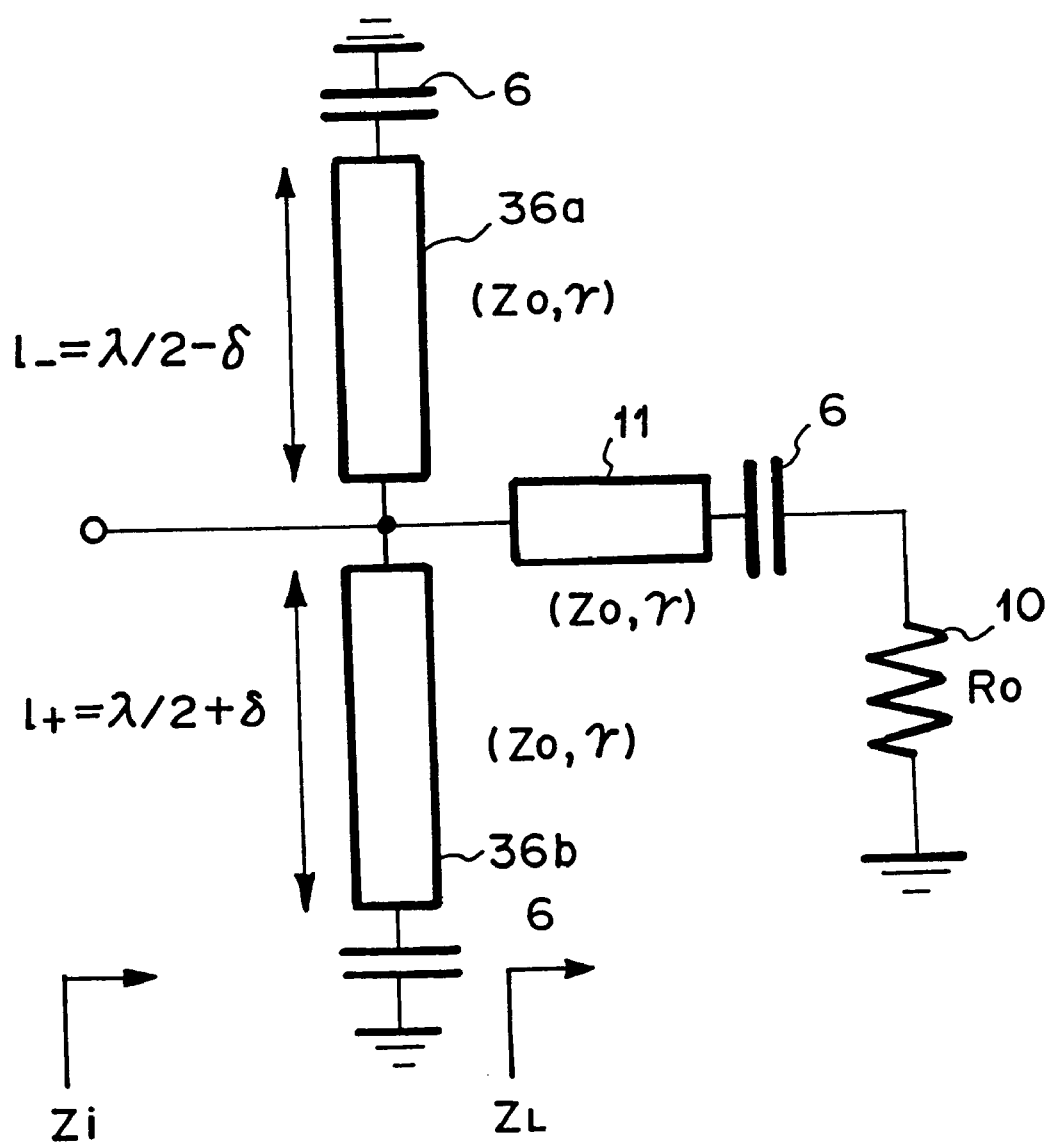
FIG. 14 is a circuit diagram for explaining the effect of the fifth aspect of the present invention.

Next, the effect of the microwave oscillator according to the fifth aspect of the present invention will be described. FIG. 14 is a circuit diagram showing a portion containing a resonating circuit and a load resistor of the microwave oscillator shown in FIG. 13. In FIG. 14, $(Z_0, \gamma)$ represents a characteristic impedance and a propagation constant of the $(\lambda/2-\delta)$ wavelength short stub 36a, $(\lambda/2+\delta)$ wavelength short stub 36b, and the transmission line 11. $R_0$ is the resistance of the load resistor 10. When the impedance viewed from the transmission line 11 to the load resistor 10 is denoted by $Z_L$, $(\lambda/2-\delta)$ is denoted by $l_-$, and $(\lambda/2+\delta)$ is denoted by $l_+$, the impedance of the two-terminal circuit shown in FIG. 14 can be expressed by formula (4).

$$Z_i = \left[\frac{1}{Z_0 \tanh(\gamma l_-)} + \frac{1}{Z_0 \tanh(\gamma l_+)} + \frac{1}{Z_L}\right]^{-1} \quad (4)$$

For simplicity, assuming that the $(\lambda/2-\delta)$ wavelength short stub 36a, the $(\lambda/2+\delta)$ wavelength short stub 36b, and the transmission line 11 have no loss and that the characteristic impedance is equal to the resistance of the load resistor (namely, $Z_0 = R_0$), the formula (4) can be expressed by formula (5).

$$Z_i = R_0 \frac{1}{1 - j(\cot\beta l_- + \cot\beta l_+)} \quad (5)$$

where $\beta$ is the phase constant of the $(\lambda/2-\delta)$ wave length short stub 36a, the $(\lambda/2+\delta)$ wavelength short stub 36b, and the transmission line 11.

$(\beta l_\pm)$ can be expressed as a function of offset angular frequency $\Delta\omega$ against the angular frequency $\omega_0$ of the fundamental wave by formula (6).

$$\beta l_\pm = \pi\left[1 + \frac{\Delta\omega}{\omega_0}\right] \pm \delta(\omega_0 + \Delta\omega)\sqrt{LC} \quad (6)$$

where L and C are the inductance and capacitance per unit length of the short-circuited stub.

In each formula, since $\Delta\omega=0$ against the fundamental wave, $\beta l_\pm$ is symmetrical with respect to $\pi$. Thus, due to odd-symmetry of a cotangent function with respect to $\pi$, the inside of the parentheses of formula (5) becomes 0. Thus, in the approximation of no-loss, the resonating circuit does not affect the fundamental wave components. On the other hand, $\Delta\omega$ against a frequency in the vicinity of the fundamental wave is not 0. Thus, $\beta l_\pm$ is not symmetrical with respect to $\pi$. At this point, the inside of the parentheses of formula (5) is not 0 and becomes very large since the cotangent function sharply varies in the vicinity of $\pi$. Thus, the two-terminal circuit shown in FIG. 14 has a sharp frequency characteristic.

(Sixth Aspect)

Figure 15:
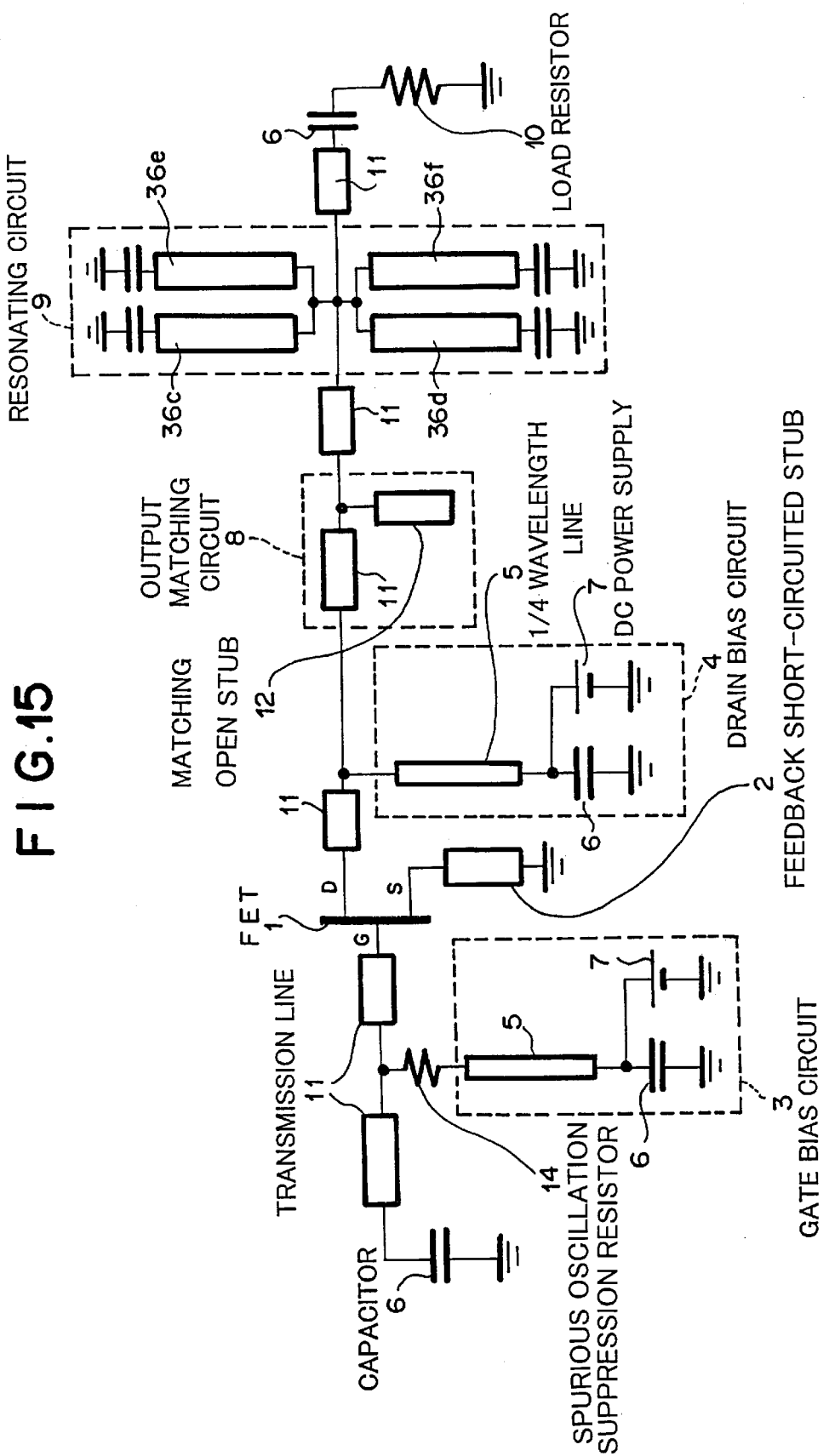
FIG. 15 is a circuit diagram for explaining the structure of a sixth aspect of the present invention.

FIG. 15 is a circuit diagram showing the structure of a microwave oscillator according to a sixth aspect of the present invention. The microwave oscillator shown in FIG. 15 has a first resonating circuit and a second resonating circuit that are connected in parallel. The first resonating circuit is composed of a $(\lambda/2-\delta_1)$ wavelength short-circuited stub 36c and a $(\lambda/2+\delta_1)$ wavelength short-circuited stub 36d. The second resonating circuit is composed of a $(\lambda/2-\delta_2)$ wavelength short-circuited stub 36e and a $(\lambda/2+\delta_2)$ wavelength short-circuited stub 36f. The length of the $(\lambda/2-\delta_1)$ wavelength short-circuited stub 36c is shorter than ½ of the wavelength of the fundamental wave by $\delta_1$. The length of the $(\lambda/2+\delta_1)$ wavelength short-circuited stub 36d is longer than ½ of the wavelength of the fundamental wave by $\delta_1$. The length of the $(\lambda/2-\delta_2)$ wavelength short-circuited stub 36e is shorter than ½ of the wavelength of the fundamental wave by $\delta_2$. The length of the $(\lambda/2+\delta_2)$ wavelength short-circuited stub 36f is longer than ½ of the wavelength of the fundamental wave by $\delta_2$. In this example, each of $\delta_1$ and $\delta_2$ is sufficiently shorter than the wavelength of the fundamental wave.

(Real Examples of First Aspect)

Figure 16:
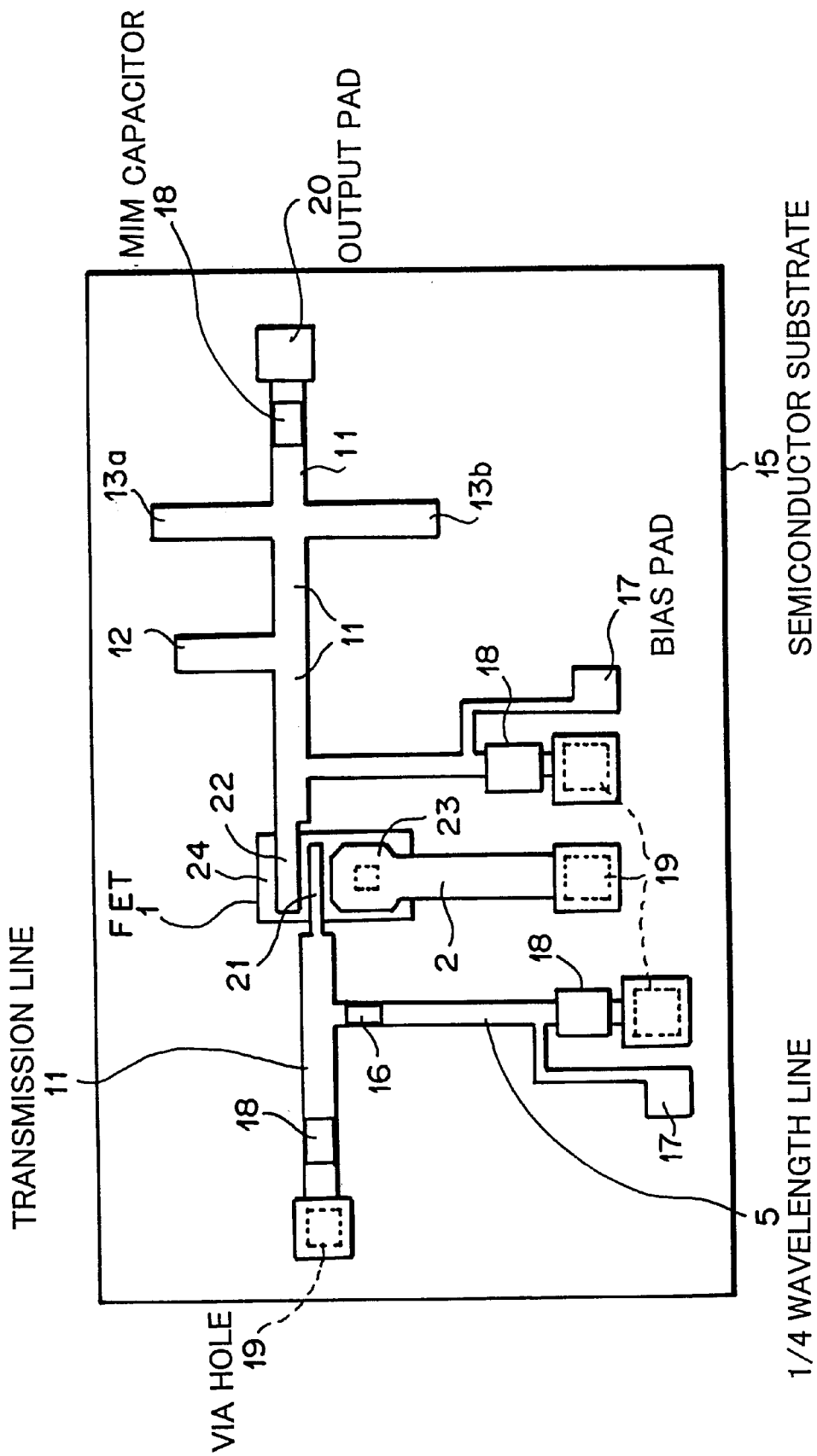
FIG. 16 is a plan view for explaining the structure of a first real example of the first aspect of the present invention.

FIG. 16 is a plan view showing the structure of a monolithic microwave oscillator according to a first real example of the first aspect of the present invention. The monolithic microwave oscillator shown in FIG. 16 is accomplished with an MMIC (Microwave Monolithic Integrated Circuit) of which transmission lines are composed of microstrip lines.

For simplicity, in the monolithic microwave oscillator shown in FIG. 16, similar portions to those shown in FIG. 6 are denoted by similar reference numerals. The monolithic microwave oscillator to shown in FIG. 16 comprises a semiconductor substrate 15, an FET 1, a feedback short-circuited stub 2, an epitaxial resistor 16, a ¼ wavelength line 5, a bias pad 17, an MIM (Metal Insulator Metal) capacitor 18, a via hole 19, a transmission line 11, a matching open stub 12, a $(\lambda/4-\delta)$ wavelength open stub 13a, a $(\lambda/4+\delta)$ wavelength open stub 13b, and an output pad 20.

A ground conductor is formed on the rear surface of the semiconductor substrate 15. The feedback short-circuited stub 2 is connected to the source electrode 23 of the FET 1. The epitaxial resistor 16 is equivalent to the spurious oscillation suppression resistor 14 shown in FIG. 6. The bias pad 17 is a terminal for supplying a DC power 7. The MIM capacitor 18 is equivalent to the capacitor 6 shown in FIG. 6. The via hole 19 is connected to the ground conductor formed on the rear surface of the semiconductor substrate 15.

The $(\lambda/4-\delta)$ wavelength open stub 13a and the $(\lambda/4+\delta)$ wavelength open stub 13b compose a resonating circuit 9. The output pad 20 is used to extract an oscillated output signal to the outside of the oscillator. The FET 1 comprises a gate electrode 21, a drain electrode 22, a source electrode 23, and an activation layer 24.

Figure 17:
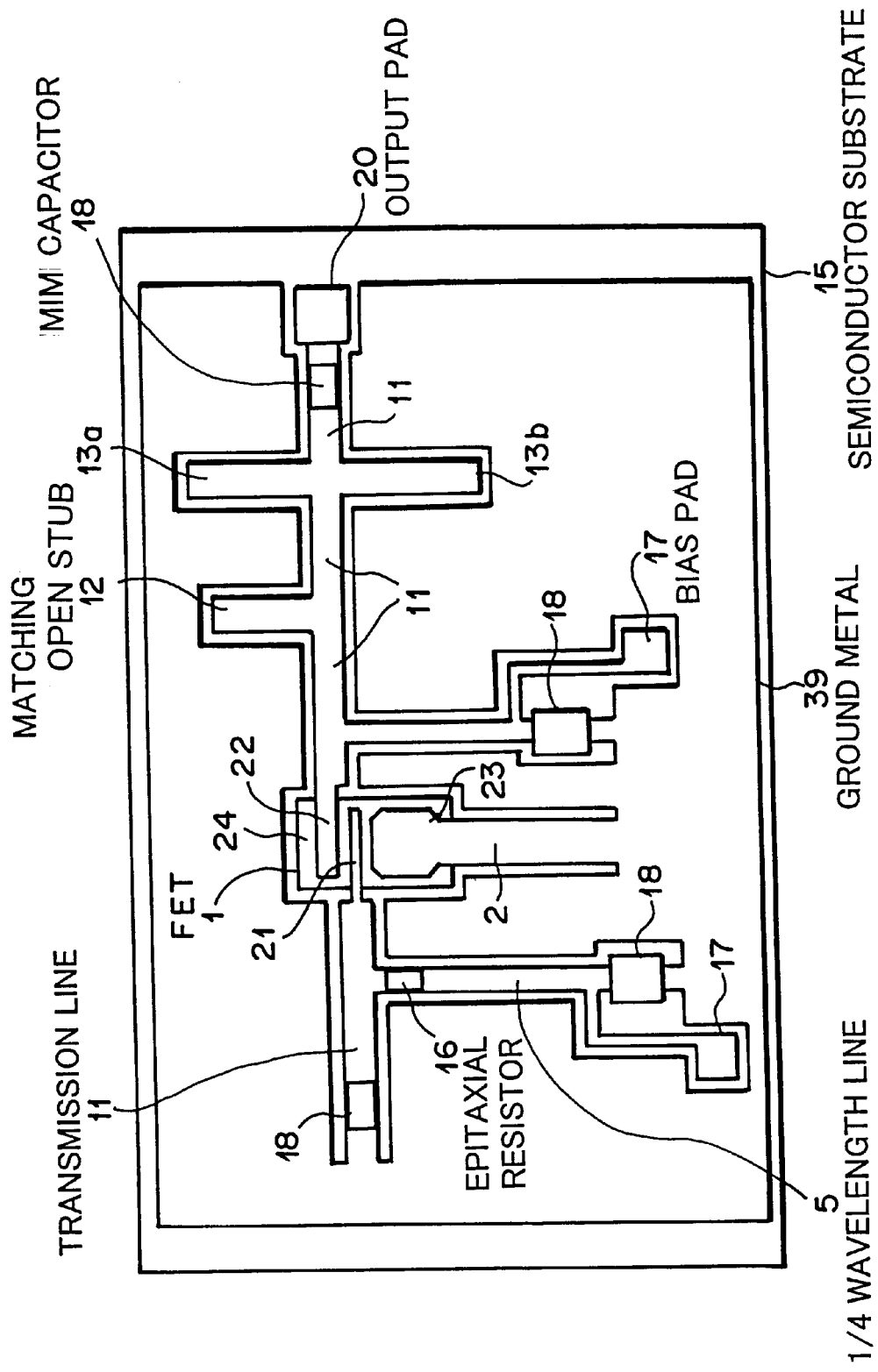
FIG. 17 is a plan view for explaining the structure of a second real example of the first aspect of the present invention.

FIG. 17 is a plan view showing the structure of a monolithic microwave oscillator according to a second real example of the first aspect of the present invention. The monolithic microwave oscillator shown in FIG. 17 is accomplished with an MMIC (Microwave Monolithic Integrated Circuit) of which transmission lines are composed of coplanar lines. The monolithic microwave oscillator shown in FIG. 17 comprises a semiconductor substrate 15, an FET 1, a a feedback short-circuited stub 2, an epitaxial resistor 16, ¼ wavelength line 5, a bias pad 17, an MIM capacitor 18, a transmission line 11, a matching open stub 12, a ($\lambda/4-\delta$) wavelength open stub 13a, a ($\lambda/4+\delta$) wavelength open stub 13b, and an output pad 20. The ($\lambda/4-\delta$) wavelength open stub 13a and the ($\lambda/4+\delta$) wavelength open stub 13b compose a resonating circuit 9. The output pad 20 is used to extract an oscillated output signal to the outside of the oscillator. The FET 1 comprises a gate electrode 21, a drain electrode 22, a source electrode 23, an activation layer 24, and a ground metal 39.

Figure 18:
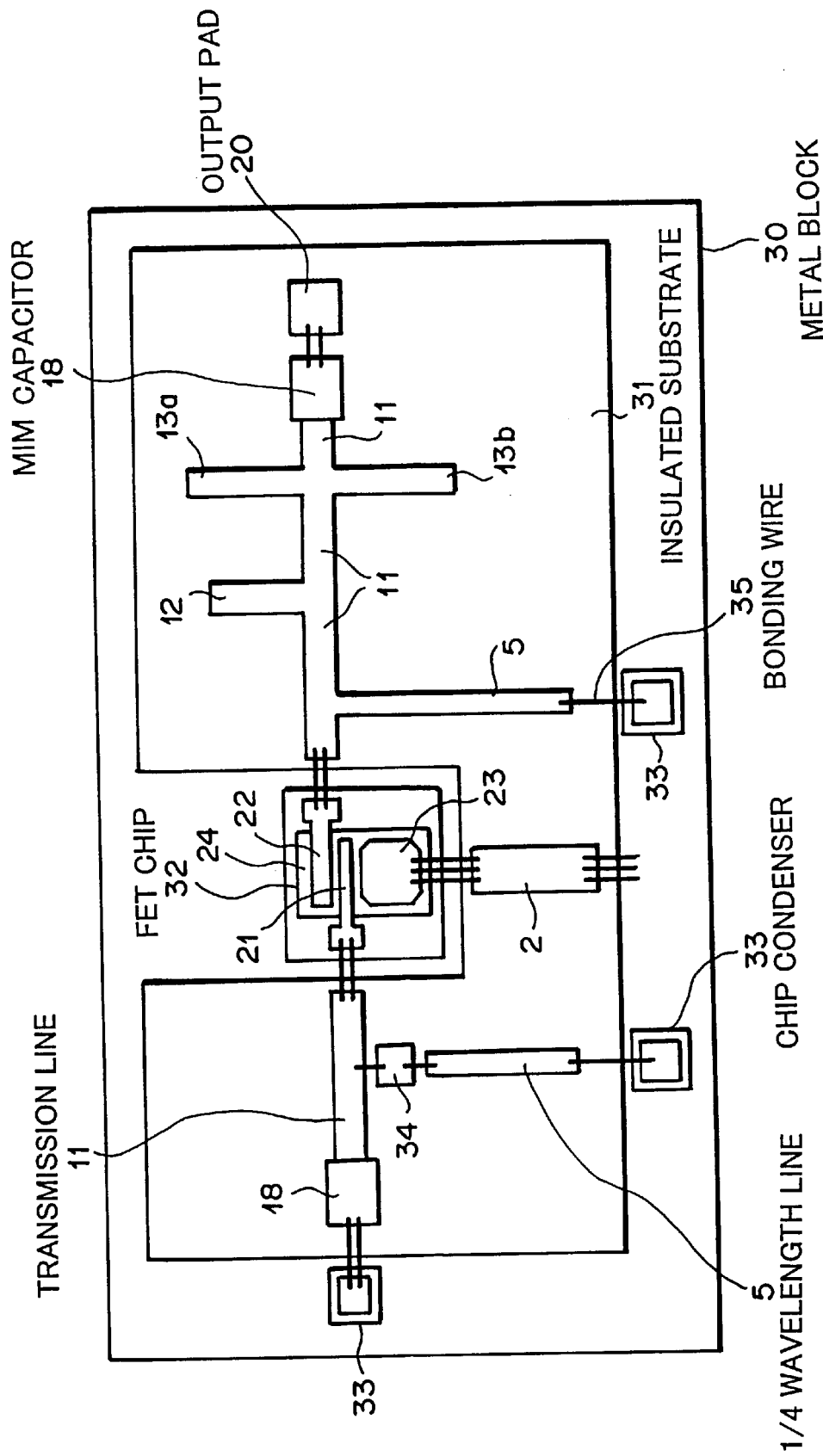
FIG. 18 is a plan view for explaining the structure of a third real example of the first aspect of the present invention.

FIG. 18 is a plan view showing the structure of a hybrid microwave oscillator according to a third real example of the first aspect of the present invention. The hybrid microwave oscillator shown in FIG. 18 is accomplished with an HIC (Hybrid Integrated Circuit) of which transmission lines are composed of micro-strip lines. The hybrid microwave oscillator shown in FIG. 18 comprises a metal block 30, an insulated substrate 31, an FET chip 32, a feedback short-circuited stub 2, a thin film resistor 34, a ¼ wavelength line 5, a chip condenser 33, an MIM capacitor 18, a transmission line 11, a matching open stub 12, a ($\lambda/4-\delta$) wavelength open stub 13a, a ($\lambda/4+\delta$) wavelength open stub 13b, and an output pad 20. The metal block 30 is grounded. The feedback short-circuited stub 2 is connected to the source electrode 2 of the FET chip 32. The thin film resistor 34 is equivalent to the spurious oscillation suppression resistor 14 shown in FIG. 6. The chip condenser 33 is equivalent to the capacitor 6 shown in FIG. 6. The ($\lambda/4-\delta$) wavelength open stub 13a and the ($\lambda/4+\delta$) wavelength open stub 13b compose a resonating circuit 9. The output pad 20 is used to extract an oscillated output signal to the outside of the oscillator. The FET chip 32 comprises a gate electrode 21, a drain electrode 22, a source electrode 23, and an activation layer 24.

In the above-described aspects of the present invention, as basic devices, FETs such as MESFETs (Metal Semiconductor Field Effect Transistors) and hetero-junction FETs are used. However, the present invention can be applied to microwave oscillators using any kinds of devices such as bipolar transistors and diodes.

In the above-described aspects of the present invention, as the circuit structure of microwave oscillators, only a particular series feedback structure was shown. However, the present invention can be applied to microwave oscillators using any kind of a circuit such as a parallel feedback oscillator of which a feedback circuit is disposed between the gate and the drain of the FET device.

Next, with reference to the accompanying drawings, embodiments of the present invention will be described.

(First Embodiment)

The microwave oscillator according to the first aspect of the present invention (shown in FIG. 6) is a series feedback 60 GHz band oscillator of which a feedback short-circuited stub 2 is connected to the source terminal of a hetero-junction FET 1 whose gate width is 100 µm and whose gate length is 0.15 µm. The characteristic impedance and the line length of the feedback short-circuited stub 2 are 50 Ω and 450 µm, respectively. A gate bias circuit 3 supplies a DC bias to the gate terminal of the FET 1 through a 100 Ω spurious oscillation suppression resistor 14.

Further, a drain bias circuit 4 supplies a DC bias to the drain terminal of the hetero-junction FET 1. Each of the bias circuits 3 and 4 is composed of a ¼ wavelength line 5, a 1 pF capacitor 6, and a DC power supply 7. A voltage of –0.5 V DC is supplied to the gate terminal of the hetero-junction FET 1. A voltage of 4V DC is supplied to the drain terminal of the hetero-junction FET 1. An oscillated output signal is extracted from a 50 Ω load resistor 10 through an output matching circuit 8 and a resonating circuit 9. The output matching circuit 8 is composed of a transmission line 11 and a matching open stub 12.

Further, the resonating circuit 9 is composed of a ($\lambda/4-\delta$) wavelength open stub 13a and a ($\lambda/4+\delta$) wavelength open stub 13b. The length of the ($\lambda/4-\delta$) wavelength open stub 13a is shorter than ¼ of the wavelength of the fundamental wave by $\delta$. The length of the ($\lambda/4+\delta$) wavelength open stub 13b is longer than ¼ of the wavelength of the fundamental wave by $\delta$. In this example, $\delta$ is sufficiently shorter than the wavelength of the fundamental wave. In reality, $\delta$ is 1/40 of the wavelength of the fundamental wave.

(Second Embodiment)

The microwave oscillator according to the second aspect of the present invention (shown in FIG. 10) has a resonating circuit. The resonating circuit is composed of a ($\lambda/4-\delta$) wavelength open stub 13a and a ($\lambda/4+\delta$) wavelength open stub 13b. The length of the ($\lambda/4-\delta$) wavelength open stub 13a is shorter than ¼ of the wavelength of the fundamental wave by $\delta$. The length of the ($\lambda/4+\delta$) wavelength open stub 13b is longer than ¼ of the wavelength of the fundamental wave by 8. The resonating circuit is connected to the gate terminal of a hetero-junction FET 1. In this example, $\delta$ is sufficiently shorter than the wavelength of the fundamental wave. In reality, $\delta$ is 1/40 of the wavelength of the fundamental wave.

(Third Embodiment)

The microwave oscillator according to the third aspect of the present invention (shown in FIG. 11) has two resonating circuits. Each of the resonating circuits is composed of a ($\lambda/4-\delta$) wavelength open stub 13a and a ($\lambda/4+\delta$) wavelength open stub 13b. The length of the ($\lambda/4-\delta$) wavelength open stub 13a is shorter than ¼ of the wavelength of the fundamental wave by $\delta$. The length of the ($\lambda/4+\delta$) wavelength open stub 13b is longer than ¼ of the wavelength of the fundamental wave by $\delta$. The resonating circuits are connected in parallel. In this example, $\delta$ is sufficiently shorter than the wavelength of the fundamental wave. In reality, $\delta$ is 1/40 of the wavelength of the fundamental wave.

(Fourth Embodiment)

The microwave oscillator according to the fourth aspect of the present invention (shown in FIG. 12) has a first resonating circuit and a second resonating circuit. The first resonating circuit and the second resonating circuit are connected in parallel. The first resonating circuit is composed of a ($\lambda/4-\delta_1$) wavelength open stub 13c and a ($\lambda/4+\delta_1$) wavelength open stub 13d. The length of the ($\lambda/4-\delta_1$) wavelength open stub 13c is shorter than ¼ of the wavelength of the fundamental wave by $\delta_1$. The length of the ($\lambda/4+\delta_1$) wavelength open stub 13c is longer than ¼ of the wavelength of the fundamental wave by $\delta_1$. The second resonating circuit is composed of a ($\lambda/4-\delta_2$) wavelength open stub 13e and a ($\lambda/4+\delta_2$) wavelength open stub 13f. The length of the ($\lambda/4-\delta_2$) wavelength open stub 13e is shorter than ¼ of the wavelength of the fundamental wave by $\delta_2$. The length of the ($\lambda/4-_2$) wavelength open stub 13f is longer than ¼ of the wavelength of the fundamental wave by $\delta_2$. Each of $\delta_1$ and $\delta_2$ is sufficiently shorter than the wavelength of the fundamental wave. In reality, $\delta_1$ is 1/40 of the wavelength of the fundamental wave. $\delta_2$ is 1/60 of the wavelength of the fundamental wave.

(Fifth Embodiment)

The microwave oscillator according to the fifth aspect of the present invention (shown in FIG. 13) has a resonating circuit 9. The resonating circuit 9 is composed of a ($\lambda/2-\delta$)

wavelength short-circuited stub 36a and a ($\lambda$/2+$\delta$) wavelength short-circuited stub 36b. The length of the ($\lambda$/2−$\delta$) wavelength short-circuited stub 36a is shorter than ½ of the wavelength of the fundamental wave by $\delta$. The length of the ($\lambda$/2+$\delta$) wavelength short-circuited stub 36a is longer than ½ of the wavelength of the fundamental wave by $\delta$. In this example, $\delta$ is sufficiently shorter than the wavelength of the fundamental wave. In reality, $\delta$ is ¹⁄₄₀ of the wavelength of the fundamental wave.

(Sixth Embodiment)

The microwave oscillator according to the sixth aspect of the present invention (shown in FIG. 15) has a first resonating circuit and a second resonating circuit. The first resonating circuit and the second resonating circuit are connected in parallel. The first resonating circuit is composed of a ($\lambda$/2−$\delta_1$) wavelength short-circuited stub 36c and a ($\lambda$/2+$\delta_1$) wavelength short-circuited stub 36d. The length of the ($\lambda$/2+$\delta_1$) wavelength short-circuited stub 36c *is shorter than* ½ of the wavelength of the fundamental wave by $\delta_1$. The length of the ($\lambda$/2+$\delta_1$) wavelength short-circuited stub 36d is longer than ½ of the wavelength of the fundamental wave by $\delta_1$. The second resonating circuit is composed of a ($\lambda$/2−$\delta_2$) wavelength short-circuited stub 36e and a ($\lambda$/2+$\delta_2$) wavelength short-circuited stub 36f. The length of the($\lambda$/2−$\delta_2$) wavelength short-circuited stub 36e is shorter than ½ of the wavelength of the fundamental wave by $\delta_2$. The length of the ($\lambda$/2+$\delta_2$) wavelength short-circuited stub 36f is longer than ½ of the wavelength of the fundamental wave by $\delta_2$. Each of $\delta_1$ and $\delta_2$ is sufficiently shorter than the wavelength of the fundamental wave. In reality, $\delta_1$ is ¹⁄₄₀ of the wavelength of the fundamental wave. $\delta_2$ is ¹⁄₆₀ of the wavelength of the fundamental wave.

(Seventh Embodiment)

FIG. 16 is a plan view showing the structure of a monolithic microwave oscillator according to a first real example of the first aspect (shown in FIG. 6) of the present invention. The monolithic microwave oscillator shown in FIG. 16 is accomplished with an MMIC (Microwave Monolithic Integrated Circuit) of which transmission lines are composed of micro-strip lines.

The monolithic microwave oscillator shown in FIG. 16 comprises a semiconductor substrate 15, a hetero-junction FET 1, a feedback short-circuited stub 2, an epitaxial resistor 16, a ¼ wavelength line 5, a bias pad 17, an MIM capacitor 18, a 30 $\mu$m square via hole 19, a transmission line 11, a matching open stub 12, a ($\lambda$/4−$\delta$) wavelength open stub 13a, a ($\lambda$/4+$\delta$) wavelength open stub 13b, and an output pad 20. The semiconductor substrate 15 is composed of GaAs of 40 $\mu$m thick. The semiconductor substrate 15 has a ground conductor composed of Au of 20 $\mu$m thick. The ground conductor is formed on the rear surface of the semiconductor substrate 15. The feedback short-circuited stub 2 is composed of Au of 2 $\mu$m thick and 30 $\mu$m wide. The epitaxial resistor 16 is composed of Si doped GaAs and Au/Ge/Ni/Au ohmic metals. The ¼ wavelength line 5 is composed of Au of 2 $\mu$m thick. The bias pad 17 is composed of Au of 2 $\mu$m thick. The MIM capacitor 18 has a dielectric film composed of SiNx of 1000 Å thick. The transmission line 11 is composed of Au of 2 $\mu$m and 30 $\mu$m wide. The matching open stub 12 is composed of Au of 2 $\mu$m thick and 30 $\mu$m width.

Further, the output pad 20 is composed of Au of 2 $\mu$m thick. The hetero-junction FET 1 comprises a gate electrode 21, a drain electrode 22, a source electrode 23, and an activation layer 24. The gate electrode 21 is composed of Al whose gate width is 100 $\mu$m and whose gate length is 0.15 $\mu$m. The drain electrode 22 and the source electrode 23 are composed of Au/Ge/Ni/Au ohmic metals. The activation layer 24 is composed of an AlGaAs donor layer, an InGaAs channel layer, and so forth. In this example, $\delta$ is sufficiently shorter than the wavelength of the fundamental wave. In reality, $\delta$ is 4 $\mu$m. 44 $\mu$m is around ¹⁄₄₀ of the wavelength of electromagnetic wave of 60 GHz transmitted in the ($\lambda$/4−$\delta$) wavelength open stub 13a and the ($\lambda$/4+$\delta$) wavelength open stub 13b.

(Eighth Embodiment)

FIG. 17 is a plan view showing the structure of a monolithic microwave oscillator according to a second real example of the first aspect (shown in FIG. 6) of the present invention. The monolithic microwave oscillator shown in FIG. 17 is accomplished with an MMIC (Microwave Monolithic Integrated Circuit) of which transmission lines are composed of coplanar lines.

The monolithic microwave oscillator shown in FIG. 17 comprises a semiconductor substrate 15, a hetero-junction FET 1, a feedback short-circuited stub 2, an epitaxial resistor 16, a ¼ wavelength line 5, a bias pad 17, an MIM capacitor 18, a transmission line 11, a matching open stub 12, a ($\lambda$/4−$\delta$) wavelength open stub 13a, a ($\lambda$/4+$\delta$) wavelength open stub 13b, and an output pad 20.

The semiconductor substrate 15 is composed of GaAs of 600 $\mu$m thick. The feedback short-circuited stub 2 is composed of Au of 2 $\mu$m thick. The epitaxial resistor 16 is composed of Si doped GaAs and Au/Ge/Ni/Au ohmic metals. The ¼ wavelength line 5 is composed of Au of 2 $\mu$m thick. The bias pad 17 is composed of Au of 2 $\mu$m thick. The MIM capacitor 18 has a dielectric film composed of SiNx of 1000 Å thick. The transmission line 11 is composed of Au of 2 $\mu$m thick and 30 $\mu$m wide.

The matching open stub 12 is composed of Au of 2 $\mu$m thick and 30 $\mu$m wide. The ($\lambda$/4−$\delta$) wavelength open stub 13a is composed of Au of 2 $\mu$m thick and 30 $\mu$m wide. The ($\lambda$/4+$\delta$) wavelength open stub 13b is composed of Au of 2 $\mu$m thick and 30 $\mu$m wide. The output pad 20 is composed of Au of 2 $\mu$m thick. The FET 1 comprises a gate electrode 21, a drain electrode 22, a source electrode 23, an activation layer 24, and a ground metal 39. The gate electrode 21 is composed of Al whose gate width is 100 $\mu$m and whose gate length is 0.15 $\mu$m. The drain electrode 22 and the source electrode 23 are composed of Au/Ge/Ni/Au ohmic metals. The activation layer 24 is composed of an AlGaAs donor layer, an InGaAs channel layer, and so forth. The ground metal 39 is composed of Au of 2 $\mu$m thick.

(Ninth Embodiment)

FIG. 18 is a plan view showing the structure of a hybrid microwave oscillator according to a third real example of the first aspect (shown in FIG. 6) of the present invention. The hybrid microwave oscillator shown in FIG. 18 is accomplished with an HIC (Hybrid Integrated Circuit) of which transmission lines are composed of micro-strip lines.

The hybrid microwave oscillator shown in FIG. 18 comprises a metal block 30, an insulated substrate 31, an FET chip 32, a feedback short-circuited stub 2, a thin film resistor 34, a ¼ wavelength line 5, a chip condenser 33, an MIM capacitor 18, a transmission line 11, a matching open stub 12, a ($\lambda$/4−$\delta$) wavelength open stub 13a, a ($\lambda$/4+$\delta$) wavelength open stub 13b, and an output pad 20. The metal block 30 is composed of Au plated Cu of 5 mm thick. The insulated substrate 31 is composed of alumina (aluminum oxide) of 100 $\mu$m thick.

Further, the FET chip 32 is composed of GaAs of 40 $\mu$m thick. The feedback short-circuited stub 2 is composed of Au of 2 $\mu$m thick. The ¼ wavelength line 5 is composed of Au of 2 $\mu$m. The transmission line 11 is composed of Au of 2 $\mu$m thick. The FET chip 32 comprises a gate electrode 21, a drain electrode 22, a source electrode 23, and an activation layer 24. The insulated substrate 31, the FET chip 32, and the chip condenser 33 are mounted on the metal block with a material such as AuSn. They are electrically connected with bonding wires composed of Au whose diameters are around 10 $\mu$m.

As described above, according to the present invention, a resonating circuit has a first open stub and a second open stub connected in parallel. The length of the first open stub is shorter than $(2n-1)/4$ (where n=1, 2, ...) of the wavelength of the fundamental wave by $\delta$ (where $\delta$ is sufficiently shorter than the wavelength of the fundamental wave). The length of the second open stub is longer than $(2n-1)/4$ of the wavelength of the fundamental wavelength by $\delta$. Thus, a microwave oscillator that is small and that has a low phase noise characteristic can be accomplished.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A microwave oscillator for oscillating a microwave signal, comprising:

a resonating circuit having a first open stub and a second open stub connected in parallel, the length of the first open stub being shorter than $(2n-1)/4$ (where n=1, 2, ...) of the wavelength of a fundamental wave by $\delta$ (where $\delta$ is sufficiently shorter than the wavelength of the fundamental wave), the length of the second open stub being longer than $(2n-1)/4$ of the wavelength of the fundamental wave by $\delta$.

2. The microwave oscillator as set forth in claim 1, wherein said resonating circuits is composed of micro-strip lines.

3. The microwave oscillator as set forth in claim 1, wherein said resonating circuits is composed of coplanar waveguides.

4. The microwave oscillator as set forth in claim 1, wherein $\delta$ is $1/200$ to $1/10$ of the wavelength of the fundamental wave.

5. A microwave oscillator for oscillating a microwave signal, comprising:

a plurality of resonating circuits each of which has a first open stub and a second open stub, said resonating circuits being connected in parallel, the length of the first open stub being shorter than $(2n-1)/4$ (where n=1, 2, ...) of the wavelength of a fundamental wave by $\delta$ (where $\delta$ is sufficiently shorter than the wavelength of the fundamental wave), the length of the second open stub being longer than $(2n-1)/4$ of the wavelength of the fundamental wave by $\delta$, the values of n of said resonating circuits being always not the same, the values of $\delta$ of said resonating circuits being always not the same.

6. The microwave oscillator as set forth in claim 5, wherein said resonating circuits are composed of micro-strip lines.

7. The microwave oscillator as set forth in claim 5, wherein said resonating circuits are composed of coplanar waveguides.

8. The microwave oscillator as set forth in claim 5, wherein $\delta$ is $1/200$ to $1/10$ of the wavelength of the fundamental wave.

9. A microwave oscillator for oscillating a microwave signal, comprising:

a resonating circuit having a first short stub and a second short stub connected in parallel, the length of the first short stub being shorter than $n/2$ (where n=1, 2, ...) of the wavelength of a fundamental wave by $\delta$ (where $\delta$ is sufficiently shorter than the wavelength of the fundamental wave), the length of the second short stub being longer than $n/2$ of the wavelength of the fundamental wave by $\delta$.

10. The microwave oscillator as set forth in claim 9, wherein said resonating circuit is composed of micro-strip lines.

11. The microwave oscillator as set forth in claim 9, wherein said resonating circuit is composed of coplanar waveguides.

12. The microwave oscillator as set forth in claim 9, wherein $\delta$ is $1/200$ to $1/10$ of the wavelength of the fundamental wave.

13. A microwave oscillator for oscillating a microwave signal, comprising:

a plurality of resonating circuits each of which has a first short stub and a second short stub, said resonating circuits being connected in parallel, the length of the first short stub being shorter than $n/2$ (where n=1, bx;12, ...) of the wavelength of a fundamental wave by $\delta$ (where $\delta$ is sufficiently shorter than the wavelength of the fundamental wave), the length of the second short stub being longer than $n/2$ of the wavelength of the fundamental wave by the values of n of said resonating circuits being always not the same, the values of $\delta$ of said resonating circuits being always not the same.

14. The microwave oscillator as set forth in claim 13, wherein said resonating circuits are composed of micro-strip lines.

15. The microwave oscillator as set forth in claim 13, wherein said resonating circuits are composed of coplanar waveguides.

16. The microwave oscillator as set forth in claim 13, wherein $\delta$ is $1/200$ to $1/10$ of the wavelength of the fundamental wave.

17. A microwave oscillator of series feedback for oscillating a microwave signal, comprising:

a resonating circuit having a first open stub and a second open stub connected in parallel, the length of the first open stub being shorter than $(2n-1)/4$ where n=1, 2, ...) of the wavelength of a fundamental wave by $\delta$ (where $\delta$ is sufficiently shorter than the wavelength of the fundamental wave), the length of the second open stub being longer than $(2n-1)/4$ of the wavelength of the fundamental wave by $\delta$.

18. The microwave oscillator of series feedback as set forth in claim 17, further comprising:

an FET;

a series feedback short-circuited stub connected to the source terminal of said FET;

a transmission line and a capacitor connected in series to the gate terminal of said FET;

a gate bias circuit connected to said transmission line through a resistor;

a drain bias circuit connected to the drain terminal of said FET through said transmission line; and an output matching circuit, a resonating circuit, and a load resistor connected in series to said transmission line, wherein said output matching circuit is composed of a transmission line and a matching open stub, said resonating circuit being composed of a first open stub and a second open stub, the length of the first open stub being shorter than $(2n-1)/4$ (where $n=1, 2, \ldots$) of the wavelength of a fundamental wave by $\delta$ (where $\delta$ is sufficiently shorter than the wavelength of the fundamental wave), the length of the second open stub being longer than $(2n-1)/4$ of the wavelength of the fundamental wave by $\delta$.

19. A microwave oscillator of parallel feedback for oscillating a microwave signal, comprising:

a resonating circuit having a first open stub and a second open stub connected in parallel, the length of the first open stub being shorter than $(2n-1)/4$ (where $n=1, 2, \ldots$) of the wavelength of a fundamental wave by $\delta$ (where $\delta$ is sufficiently shorter than the wavelength of the fundamental wave), the length of the second open stub being longer than $(2n-1)/4$ of the wavelength of the fundamental wave by $\delta$.

20. The microwave oscillator of parallel feedback as set forth in claim 19, further comprising:

an FET;

a parallel feedback short-circuited stub connected between the gate terminal and the drain terminal of said FET;

a transmission line and a capacitor connected in series to the gate terminal of said FET;

a gate bias circuit connected to said transmission line through a resistor;

a drain bias circuit connected to the drain terminal of said FET through said transmission line; and an output matching circuit, a resonating circuit, and a load resistor connected in series to said transmission line, wherein said output matching circuit is composed of a transmission line and a matching open stub, said resonating circuit being composed of a first open stub and a second open stub, the length of the first open stub being shorter than $(2n-1)/4$ (where $n=1, 2 \ldots$) of the wavelength of a fundamental wave by $\delta$ (where $\delta$ is sufficiently shorter than the wavelength of the fundamental wave), the length of the second open stub being longer than $(2n-1)/4$ of the wavelength of the fundamental wave by $\delta$.

\* \* \* \* \*

UNITED STATES PATENT AND TRADEMARK OFFICE
CERTIFICATE OF CORRECTION

PATENT NO. : 6,259,332 B1　　　　　　　　　　　　　　　　　　　　　Page 1 of 1
DATED : July 10, 2001
INVENTOR(S) : Kenichi Hosoya It is certified that error appears in the above-identified patent and that said Letters Patent is hereby corrected as shown below:

Column 5,
Line 55, delete "$B1_{35}$" insert -- $B1_{\pm}$ --

Signed and Sealed this

Twenty-sixth Day of March, 2002

Attest:

JAMES E. ROGAN
*Attesting Officer*　　　*Director of the United States Patent and Trademark Office*